(12) United States Patent
Bonora et al.

(10) Patent No.: US 6,579,052 B1
(45) Date of Patent: *Jun. 17, 2003

(54) SMIF POD STORAGE, DELIVERY AND RETRIEVAL SYSTEM

(75) Inventors: Anthony C. Bonora, Menlo Park, CA (US); Raymond S. Martin, San Jose, CA (US); Robert Netsch, Alameda, CA (US); Joshua T. Oen, Fremont, CA (US); Terry Mosier, Saratoga, CA (US); William J. Fosnight, Austin, TX (US)

(73) Assignee: Asyst Technologies, Inc., Fremont, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/891,543

(22) Filed: Jul. 11, 1997

(51) Int. Cl.$^7$ ................................................. B65G 1/00
(52) U.S. Cl. .................... 414/222.01; 414/281; 414/940
(58) Field of Search ................................. 414/283, 940, 414/281, 937, 222.01, 225.01

(56) References Cited

U.S. PATENT DOCUMENTS

| | | | | |
|---|---|---|---|---|
| 4,614,474 A | * | 9/1986 | Sudo | 414/618 |
| 4,844,679 A | * | 7/1989 | Teranishi | 414/618 |
| 5,059,079 A | * | 10/1991 | Foulke et al. | 414/275 |
| 5,220,548 A | * | 6/1993 | Nakatsukasa et al. | 414/280 |
| 5,284,412 A | * | 2/1994 | Shiraiwa et al. | 414/277 |
| 5,377,476 A | * | 1/1995 | Bohmer et al. | 414/937 |
| 5,387,265 A | * | 2/1995 | Kakizaki et al. | 29/25.01 |
| 5,464,313 A | * | 11/1995 | Ohsawa | 414/172 |
| 5,628,604 A | * | 5/1997 | Murata et al. | 414/283 |
| 5,772,386 A | * | 6/1998 | Mages et al. | 414/411 |
| 5,810,538 A | * | 9/1998 | Ozawa et al. | 414/937 |
| 5,964,561 A | * | 10/1999 | Marohl | 414/217 |
| 5,980,183 A | * | 11/1999 | Fosnight | 414/222.01 |

FOREIGN PATENT DOCUMENTS

| | | | | |
|---|---|---|---|---|
| JP | 62-130534 | * | 6/1987 | 414/940 |
| JP | 3-244121 A | | 10/1991 | H01L/21/22 |
| JP | 4-171716 A | | 6/1992 | H01L/21/22 |
| JP | 7-10213 | * | 1/1995 | |

OTHER PUBLICATIONS

Solid State Technology, Jul. 1997 entitled "Specify Duke Standards or Take Your Chances. Duke Scientific Delivers Calibrated, Traceable, and Certified Particle Size Standards", pp. 106, 108.

* cited by examiner

*Primary Examiner*—Thomas J. Brahan
(74) *Attorney, Agent, or Firm*—O'Melveny & Myers LLP

(57) ABSTRACT

A storage, delivery and retrieval system having a rear wall to which is affixed a plurality of shelves capable of supporting one or more wafer-carrying pods. The structure further includes a pair of vertical rails lying in a plane spaced from and substantially parallel to the shelf-supporting wall. The horizontal rail extends between and is translationally mounted to the vertical rails, which horizontal rail supports a gripper capable of movement along the horizontal rail. The movement of the horizontal rail along the vertical rails, and the movement of the gripper along the horizontal rail, allows the gripper to be positioned at any location within an X-Z plane including the storage shelves. The system includes a two-dimensional transport system. That is, all transport of the pods by the system occurs without the pods ever leaving the X-Z plane of the shelves. This feature contributes to the overall small footprint of the system. Additionally, the gripper moves around in the same plane as the pods, and the rails have a small profile and operate directly adjacent the storage shelves. These features further contribute to the storage, delivery and retrieval system according to the present invention.

14 Claims, 19 Drawing Sheets

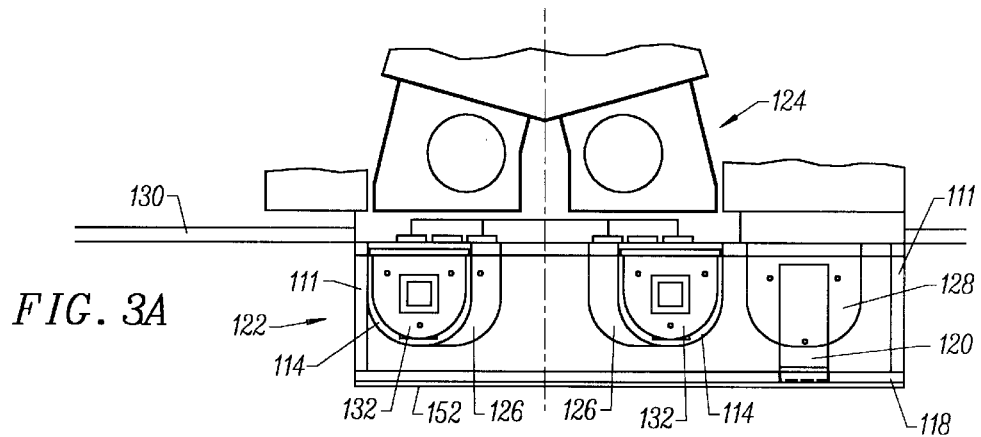
FIG. 3A
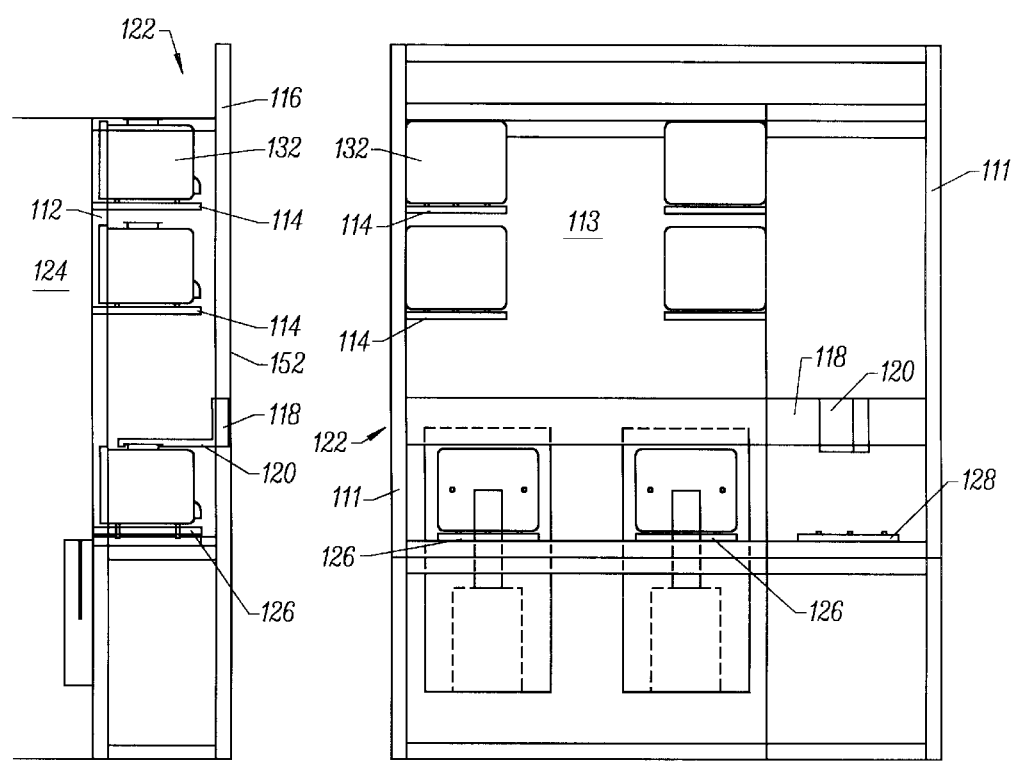
FIG. 3B
FIG. 3C

SMIF POD STORAGE, DELIVERY AND RETRIEVAL SYSTEM

CROSS REFERENCE TO RELATED APPLICATION

The present application is related to U.S. patent application Ser. No. 08/843,245, entitled INTEGRATED INTRABAY BUFFER, DELIVERY, AND STOCKER SYSTEM, filed Apr. 14, 1997, now U.S. Pat. No. 5,980,183 which application is assigned to the owner of the present application, and which application is incorporated by reference herein in its entirety.

BACKGROUND OF THE INVENTION

1. Field of the Invention

The present invention relates to the transport and storage of semiconductor wafers, and in particular to a system capable of storing wafer-carrying pods and/or cassettes and capable of transferring wafer-carrying pods and/or cassettes to and from a semiconductor processing tool, which system provides a high degree of flexibility, operates with a minimum amount of hardware and software control and makes efficient use of space.

2. Description of Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

The SMIF system provides a clean environment for articles by using a small volume of particle-free gas which is controlled with respect to motion, gas flow direction and external contaminants. Further details of one proposed system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with present geometry semiconductor devices. The trend, of course, is to have smaller and smaller semiconductor processing geometries which today in research and development labs approach 0.2 $\mu$m and below. In the future, geometries will become smaller and smaller and hence smaller and smaller contamination particles become of interest.

A SMIF system includes a minimum volume, sealed pod used for storing and transporting wafers or other workpieces. Within a wafer fab, a first automated transport system is provided for transferring the SMIF pods from one processing tool bay to another (interbay delivery systems) and a second automated transport system may be provided for transferring the pods around within each particular bay (intrabay delivery systems). Tool bays are typically on the order of about 80 feet long, and consist in general of a number of processing tools for performing various wafer fabrication functions, metrology tools for monitoring or testing a wafer or wafers from within a wafer lot, and at least one stocker for storing the pods before or after processing.

Some processing tools within a tool bay are typically high throughput tools which are capable of performing their particular wafer process at a relatively higher rate than other processing tools. Similarly, as metrology tools only sample one wafer per lot, these tools also are capable of handling substrate carriers at a much higher rate than typical processing tools. Presently, a semiconductor wafer fab may cost in excess of $1.6 billion, and approximately 80% of that cost is the cost of equipment. It is therefore desirable to maximize the yield of this equipment, and substantial efforts are devoted to minimizing the time that the tools sit idle.

In order to prevent significant idle time for high throughput and metrology tools, it is known to include a local tool buffer adjacent the tool load ports of high throughput and metrology tools. In this way, pods may be stored locally adjacent such tools and quickly transferred to the tool load port without having to constantly retrieve a pod from the remotely located stocker, or depend on timely delivery therefrom. A conventional local tool buffer is shown generally at 10 adjacent a process tool 12 in FIG. 1A. As shown therein, a pod handling robot 14 is capable of transferring pod 16 between a plurality of local shelves 18 and the tool load ports 20 on the process tool. The pod handling robot 14 includes a base 21 mounted to a track 22 so as to translate along the z-axis. First and second arms 24 and 26 and a gripper 28 are attached to the base 21 and are controlled by computer to grip a pod 16 for transfer between the shelves 18 and the tool load ports 20.

Conventional local buffers, such as that shown in FIG. 1A, have several shortcomings. First, it is the nature of the robot used therein that it can only reach one carrier space to its left or right. Thus, the storage spaces available to such a robot are limited to being directly adjacent the robot. A second significant shortcoming of conventional local buffers is that they utilize three-dimensional transport of the pods. That is, the pods are transported outside of the X-Z plane in which they are stored. The footprint of such conventional buffers must be large enough to accommodate this three-dimensional transport.

A still further shortcoming to conventional local buffers relates to the storage density of such systems. Storage density refers to the ratio of storage space available to the overall footprint required by the local buffer. FIG. 1B is a graphical representation of the storage density of the local buffer shown in FIG. 1A (each box represents a space capable of being occupied by a single wafer-carrying pod), with the outline of the robot provided thereon. As shown, storage spaces are available in the lower left and right positions 1 and 2 of the buffer. As the track 22 must be off-set from the robot in order to allow pods to be passed in front of the robot (i.e., between the robot and the buffer wall), the lower middle space is utilized for vertical pod travel and is unavailable for pod storage. Similarly, the spaces to the left and right of the robot base (in the top center) are inaccessible due to the position of the stored pod and track 22. Thus the resulting storage density for a two-deep local buffer is 2 to 6, or 33%.

A mechanism similar to that shown in FIG. 1A may be used as a stocker for pod storage. Such conventional stockers may additionally include a second bank of storage spaces juxtaposed to the first bank. The storage density of this system is graphically represented in FIG. 1C. As shown, the robot may be configured to translate in the direction of arrow A—A. By adding the additional bank, the storage density improves to 4 to 9, or about 45%. However, this is still a relatively low ratio, and it comes at the expense of a large footprint.

SUMMARY OF THE INVENTION

It is therefore an advantage of the present invention to provide a process tool storage, delivery and retrieval system for supplying pods to semiconductor process and metrology tools.

It is another advantage of the present invention to provide two-dimensional transport of a wafer carrier, wherein a carrier is transported in the same plane in which it is stored It is a further advantage of the present invention to provide a storage space for wafer carriers having a maximum storage density within a minimum incremental footprint relative to the process tool's original footprint without the buffer.

It is a still further advantage of the present invention to provide a tool integrated pod storage, delivery and retrieval system having a small overall footprint.

It is another advantage of the present invention to provide a tool integrated pod storage, delivery and retrieval system which may be easily scaled to different sizes.

It is a further advantage of the present invention to provide a highly reliable tool integrated pod storage, delivery and retrieval system.

It is another advantage of the present invention to provide a tool integrated pod storage, delivery and retrieval system capable of minimizing the creation of particulates in the cleanroom.

It is a further advantage of the present invention to provide a tool integrated pod storage, delivery and retrieval system capable of minimizing tool idle time.

It is a further still advantage of the present invention to provide a tool integrated pod storage, delivery and retrieval system of highly flexible design, easily adapted to variously configured process tools and pod delivery systems.

It is another advantage of the present invention to provide a tool integrated pod storage, delivery and retrieval system having a simple design and requiring relatively little maintenance.

It is a further advantage of the present invention to provide a tool integrated pod storage, delivery and retrieval system which may coexist safely with human operators working near the process tools.

These and other advantages are accomplished by the present invention, which in preferred embodiments relates to a pod storage, delivery and retrieval system capable of providing an improved local tool buffer for various semiconductor process tools or an improved stocker for storing pods in a semiconductor tool bay. A basic embodiment of the invention comprises a structure having a rear wall to which is affixed a plurality of shelves capable of supporting one or more wafer-carrying pods. The structure further includes a pair of vertical rails lying in a plane spaced from and substantially parallel to the shelf-supporting wall. A horizontal rail extends between and is translationally mounted to the vertical rails, which horizontal rail supports a gripper capable of movement along the horizontal rail. The movement of the horizontal rail along the vertical rails, and the movement of the gripper along the horizontal rail, allows the gripper to be positioned at any location within an X-Z plane including the storage shelves.

In one embodiment of the invention, the above-described storage, delivery and retrieval system may be mounted to the front surface of a process tool. Process tools conventionally include tool load ports protruding from the front of the tool into the tool bay. The storage, delivery and retrieval system according to the present invention preferably fits over the tool load port so as not to increase the depth of the tool (i.e., the distance of the tool away from the tool bay wall) beyond that occupied by the tool load port.

In a preferred embodiment, the shelves are provided within the storage, delivery and retrieval system in a plurality of rows and columns defining spaces in which the gripper may translate vertically and horizontally. The shelves may be provided in various configurations, including being one, two, or more deep in a direction perpendicular to the X-Z plane, and may also have one, two, or more shelves directly adjacent to each other in the X-Z plane. It is a feature of the present invention that the gripper, when not gripping a pod, may translate horizontally through shelves having a pod thereon. The movement of the gripper along the horizontal rail, and the movement of the horizontal rail along the vertical rails, may be controlled so that the system may transfer pods between the storage shelves and the tool load port of the process tool.

It is a feature of the present invention that the above-described transport system is a two-dimensional transport system. That is, all transport of the pods between the ports and the storage shelves occurs without the pods ever leaving the X-Z plane of the ports and the shelves. This feature contributes to the overall small footprint of the system. Additionally, the gripper moves around in the same plane as the pods, and the rails have a small profile and operate directly adjacent the storage shelves. These features further contribute to the small footprint of the system.

The present storage, delivery and retrieval system may be provided in various orientations with respect to the process tool it is serving. In one embodiment, the system may be mounted on the front surface of a process tool, around the tool load port, and extending approximately the depth of one pod into the tool bay. In a further embodiment of the invention, the process tool and storage, delivery and retrieval system may be moved back such that the front of the storage, delivery and retrieval system adjacent the tool bay is flush with the tool bay wall. In this embodiment, various configurations of shelves may extend from the storage, delivery and retrieval system into the tool bay to receive a pod from the standard intrabay pod delivery mechanisms.

In a further embodiment of the present invention, the storage, delivery and retrieval system may be mounted to the side of a process tool, entirely within the space behind the process tool bay wall and in between adjacent process tools. In this embodiment, the storage, delivery and retrieval system may include various configurations of shelves extending out of the side of the system and into the tool bay for receiving a pod from the intrabay pod delivery systems. Alternatively, the storage, delivery and retrieval system may itself extend partially into the tool bay to receive a pod from the delivery system.

In a further embodiment of the present invention, two or more storage, delivery and retrieval systems may service a single processing tool. In this embodiment, the systems may be oriented side-by-side at the front or side of a processing tool. Alternatively, the systems may be provided back-toback at the front or side of the process tool. Various configurations of conveyors and/or telescoping shelves may be provided for transferring pods between the adjacent systems of the multiple storage, delivery and retrieval systems. It is also contemplated that conveyors may be provided for linking storage, delivery and retrieval systems mounted on separate process tools. In a further embodiment of the present invention, a single storage, delivery and retrieval system may be sized to serve and link more than one process tool.

In a still further embodiment, the present invention may comprise a standalone stocker for storing a plurality of pods. As in the embodiments of the invention comprising a local tool buffer, owing in part to the ability of the present invention to transport pods in the same plane in which they are stored, the ability of the gripper to travel around in the same plane as the pods, and the small profile of the transport rails, the stocker according to the present invention may operate in an extremely small footprint.

BRIEF DESCRIPTION OF THE DRAWINGS

The present invention will now be described with reference to the drawings in which:

FIG. 3A is a top view of a storage, delivery and retrieval system according to the present invention adjacent the front of a process tool;

FIG. 3B is a side view of the storage, delivery and retrieval system shown in FIG. 3A;

FIG. 3C is a front view of the storage, delivery and retrieval system shown in FIG. 3A;

DETAILED DESCRIPTION

The present invention will now be described with reference to FIGS. 2–14, which in general relate to a system for storing and transferring a plurality of pods. In a first embodiment, the system may be mounted adjacent a process or metrology tool to provide local buffering for the tool. In a second embodiment, the system may be a stand-alone stocker capable of storing relatively large numbers of pods in a small footprint. While the preferred embodiment of the invention may operate with SMIF pods, it is understood that the type of pod utilized is not critical to the present invention, and any of various containers in which semiconductor wafers are housed may operate with the present invention. This includes, but is not limited to, pods of various sizes, bottom opening pods, front opening pods, cassetteless pods, and open cassettes in which the wafers are seated. Additionally, it is contemplated that workpieces other than semiconductor wafers may be provided within the pods, including reticles, flat panel displays, and other substrates which may be stored and/or transported within pods and cassettes.

Figure 2:
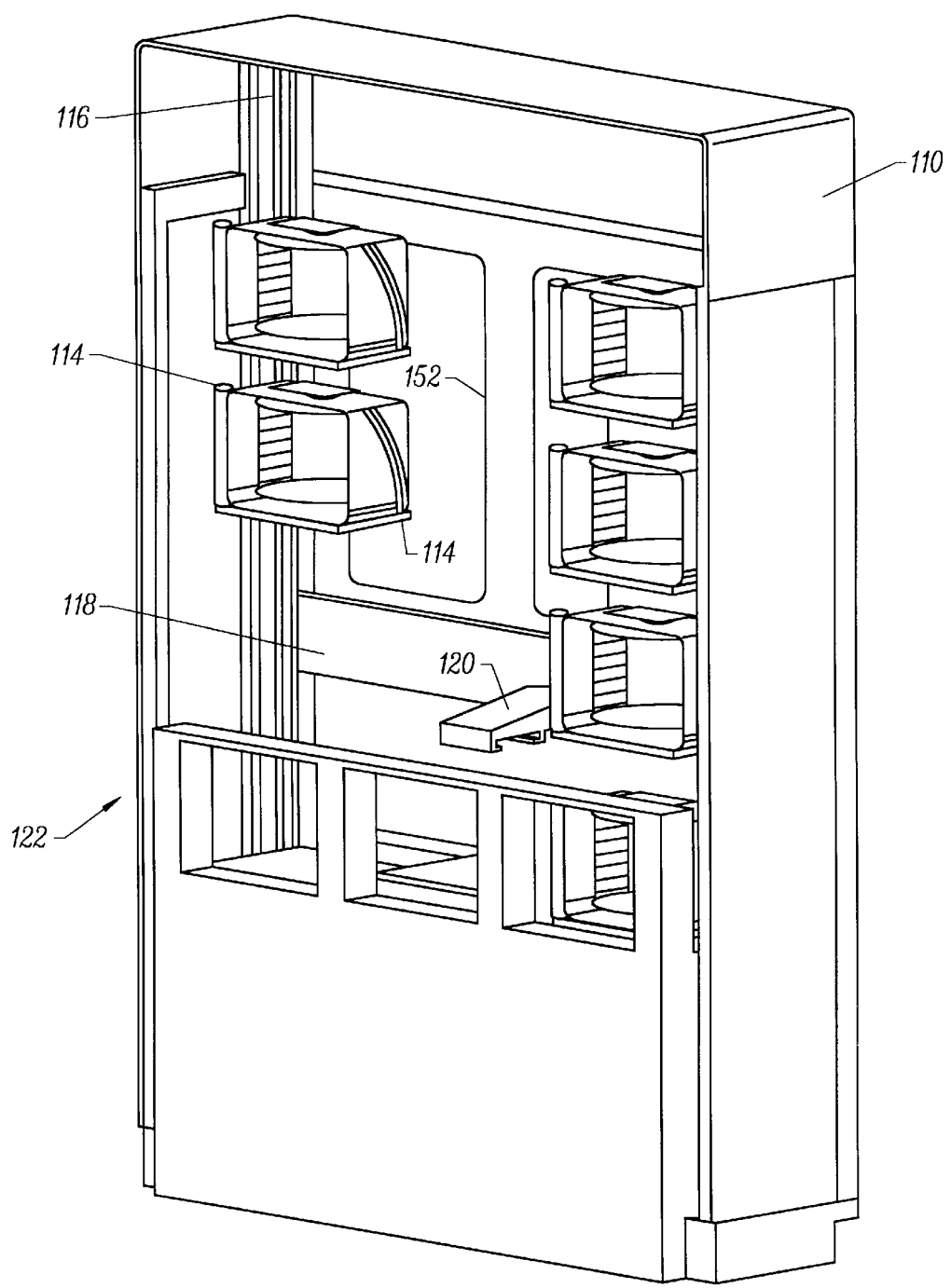
FIG. 2 is a perspective view of a pod storage, delivery and retrieval system according to the present invention.

A basic embodiment of the invention is shown in the rear perspective view of FIG. 2. The storage, delivery and retrieval (SDR) system 122 shown therein comprises a support structure 110 having a rear wall (omitted for clarity) to which is affixed a plurality of shelves 114 capable of supporting one or more pods, cassettes, or other such containers. The support structure further includes a pair of vertical rails 116 (only one such rail is shown in FIG. 2) lying in a plane spaced from and substantially parallel to the shelf-supporting wall. A horizontal rail 118 extends between and is translationally mounted to the vertical rails, which horizontal rail supports a gripper 120 capable of movement along the horizontal rail. The movement of the horizontal rail along the vertical rails, and the movement of the gripper along the horizontal rail, allows the gripper to be positioned at any location within an X-Z plane. The above-described structure cooperates with a semiconductor process tool, or stands by itself, according to the several embodiments described below.

Single Storage, Delivery and Retrieval System on Single Process Tool

Referring now to the top, side and front views of FIGS. 3A, 3B and 3C, respectively, there is shown an SDR system 122 mounted to a front portion of a processing tool 124. In preferred embodiments of the invention, tool 124 may comprise a high throughput or metrology tool, but it is understood that the tool 124 may be any of various semiconductor processing tools. Each processing tool 124 preferably includes at least one tool load port 126 for accepting a SMIF pod and for transferring wafers between the pod and the interior of the process tool. Tools 124 preferably further include a manual input/output (I/O) port 128 for receiving a pod manually by a human operator, or by various automated delivery systems. As is known in the art, the process tool 124 is primarily located behind a tool bay wall 130, in a space referred to as the chase, with a front surface of the tool including the tool load port and manual I/O port protruding into the tool bay.

A rear wall 112 (FIG. 3B) of the SDR system 122 is preferably mounted adjacent a front surface of the process tool 124. In a preferred embodiment of the invention, the SDR system 122 is preferably floor mounted and further mounted to the ceiling and/or front of the process tool to promote stability. In alternative embodiments of the invention, it is understood that the SDR system may be mounted solely to the floor, or solely to the ceiling and/or front of the tool.

In a preferred embodiment of the invention, shelves 114 are mounted to wall 112 and protrude outward away from the front of the processing tool 124. In alternative embodiments of the invention, shelves may alternatively be mounted to side walls 111 (FIGS. 3A and 3C), protruding inward toward the center of the SDR system. Each shelf has an upper surface capable of supporting a pod 132. In a preferred embodiment, the vertical distance between shelves is just large enough to allow the gripper to enter between the top of a pod and the next upper shelf, and to lift and carry the pod away. However, it is understood that pods of various heights and housing various sized wafers may be used within the present invention, and the size of the shelves as well as the vertical spacing between shelves may vary.

Figure 4A:
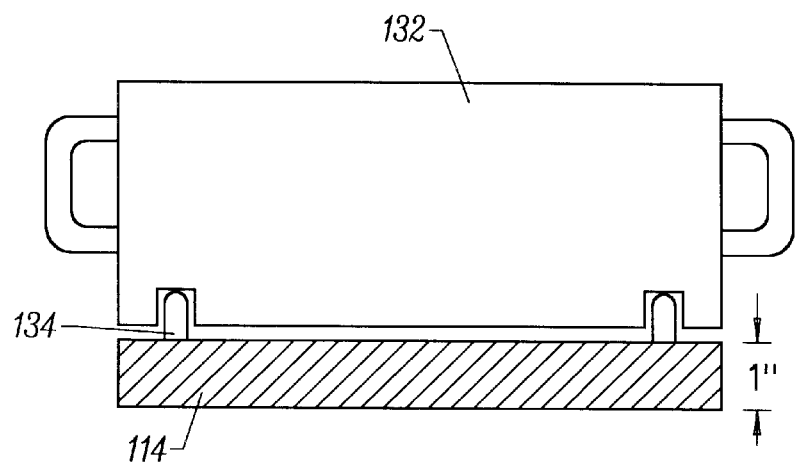
FIG. 4A is a front view of a semiconductor pod seated on a shelf according to the present invention.
Figure 4B:
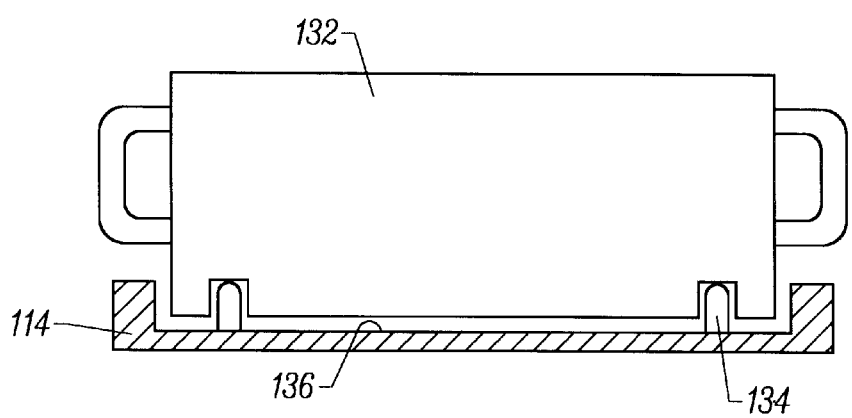
FIG. 4B shows a pod sitting on a shelf according to an alternative embodiment of the present invention.

Each shelf 114 is preferably formed of a rigid material having low particulating and outgassing properties, such as for example aluminum with an anodized surface finish. Additionally, as shown in FIG. 4A, each shelf may include autokinematic mounting pins 134 on its upper surface for mating with grooves on the lower surface of each pod to securely position and hold the pods on the shelves. In order to remove a pod from a shelf, the gripper must first lift the pod 132 sufficiently to clear the pins 134. Therefore, in an alternative embodiment of the invention shown in FIG. 4B, the shelves may include a sunken area 136 surrounding pins 134 to thereby decrease the total distance between the bottom of a shelf and the upper surface of a pod when it has been lifted and first clears the pins 134. In this way, the vertical stacking density of the pods within the shelves may be increased.

As shown in FIG. 3C, in one embodiment of the invention, the shelves are aligned in a plurality of rows and columns. It is however understood that the shelves according to the present invention may be provided in various configurations both above and below the tool load ports of tool 124. The shelves are preferably grouped in columns so as to define at least one vertical space 113. Space 113 is provided to allow the pods to be vertically transferred between any shelf in the SDR system and the tool load ports/manual I/O ports. It is understood that the location and number of spaces 113 defined by the grouping of shelves 114 may vary in alternative embodiments of the invention. Additionally, certain standards set by the Semiconductor Equipment and Materials Industry (SEMI) require that a clear vertical path be left over the manual I/O port to allow a pod to be lowered thereon from the overhead delivery system. Thus, at least one of the vertical spaces 113 may lie over the manual I/O port 128 to satisfy this SEMI standard.

Figure 3D:
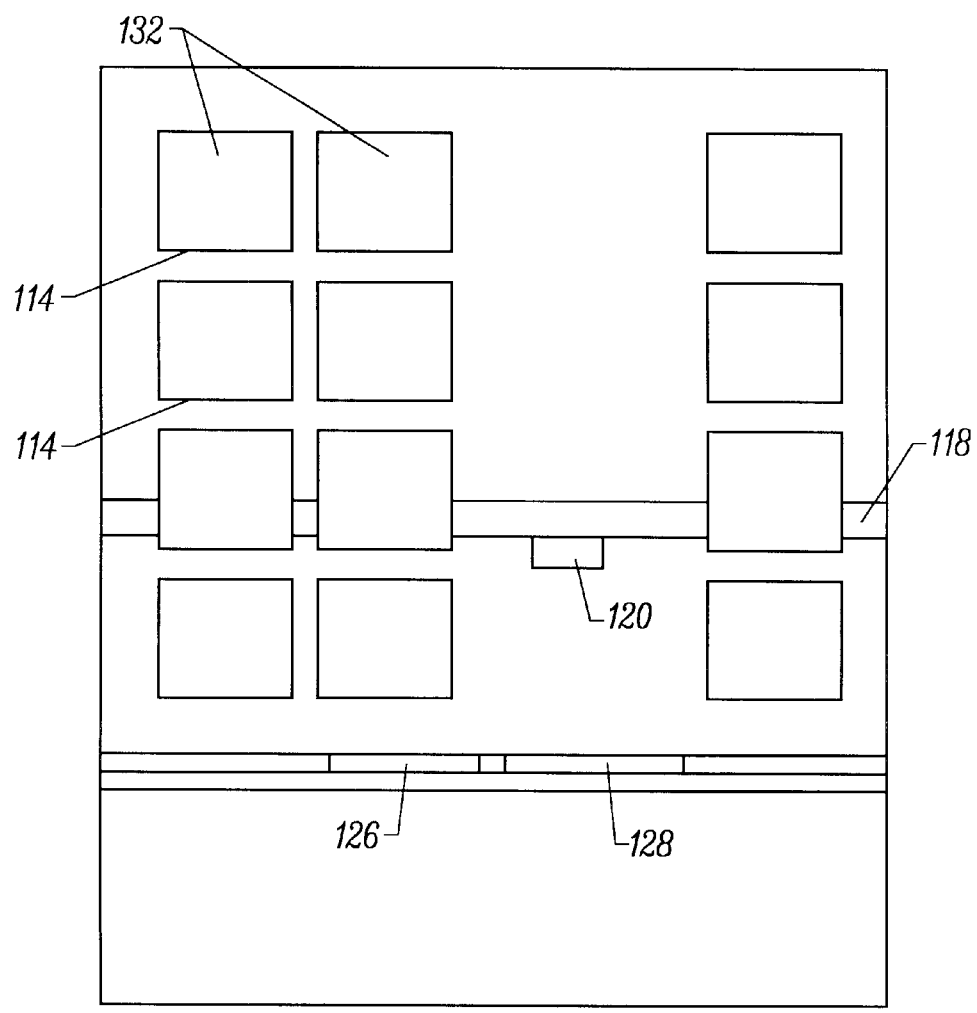
FIG. 3D is a front view of a storage, delivery and retrieval system including an alternative storage shelf configuration according to the present invention.

As shown in FIG. 3D, it is also contemplated that two columns of storage shelves 114 may be provided adjacent to each other. In this embodiment, in order to access a pod in the blocked column (i.e., the left column in FIG. 1D), the adjacent pod in the next column must first be moved. Such a configuration is well suited to "batch processing", where pods are consecutively loaded in pairs onto the load ports for processing. It is also contemplated that more than two adjacent storage shelf columns be provided.

In conventional local tool buffers, as indicated in the Background of the Invention section, the range of motion afforded the gripper by the transfer robot is limited. As such, the location of the local storage shelves, tool load ports, and manual I/O ports is limited, to ensure that they could be reached by the gripper. However, as explained in greater detail below, the transport mechanism according to the present invention is capable of moving the gripper anywhere within the boundaries of the X-Z plane defined by the SDR system. The advantage realized with such a system is that the storage shelves may be located at any position on the wall 112 of the SDR system, and the position of the tool load ports and manual I/O ports may vary significantly. This feature of the present invention greatly increases the flexibility of the present invention, and the degree to which the invention may be adapted for use with different processing tools, wafer fabs, and containers. For example, the shelves may be positioned within the SDR system independently of the position of the tool load ports. Thus, different configurations of the SDR system may be used with a single process tool, and a single SDR system may be used with process tools of different configurations. Moreover, the SDR system with shelves 114 may be manufactured without having to know the particular tool configuration.

In addition, the ability of the transport system to access any X-Z point in the SDR system provides several flexibility advantages directly related to the process tool, in that the tool load ports need not be located side-by-side at the conventional 900 mm height First, this allows the tool load ports to be repositioned to more desirable locations on the process tool. For example, by raising the height of one or both tool load ports, this increases the volume of space within the tool beneath the wafer processing plane; thereby allowing the tool footprint to be reduced. Additionally, it is at times desirable to access wafers from stacked carriers or positions within the tool. However, most robots do not have sufficient room from the floor for the Z-axis stroke required to access each of the wafers in the stacked cassettes. By raising the elevation of the load ports, the Z-axis stroke of the robot may be increased. A still further advantage provided by the flexible positioning of the tool load ports according to the present invention is that one tool load port may be located directly above another tool load port, thus potentially allowing a reduction in the overall width of a process tool.

With regard to the X-Z gripper transport, the system is capable of operation with all conventional schemes for delivering a pod to a process tool or local buffer. Presently, pods are delivered to process tools or local buffers by one of four general systems. First, it is known to transfer pods around within a tool bay on an overhead delivery system which may comprise a series of pod hand-off interfaces for transferring pods to vertical elevators which in turn lower the pods into the local buffer or directly down onto the tool load port. Such overhead delivery systems may also comprise a monorail cable hoist, where a cable lowers a pod into an upper shelf of the local buffer or onto the tool load port once the overhead monorail is positioned at the desired location. A second mode of pod delivery to the tool or local buffer is by conveyor. Conveyors may operate at varying elevations within the tool bay, and may connect between varying numbers of tools and buffers. A third known system of pod delivery is by guided vehicles traveling around the tool bay floor which deliver pods to ports at the 900 mm SEMI standard height. Such guided vehicles include person guided vehicles (PGVs), automatic guided vehicles (AGVs), and rail guided vehicles (RGVs). These guided vehicles generally load pods onto tool load ports or manual I/O ports from the side (as opposed to overhead delivery systems which deliver pods from the top). Finally, pods may be loaded into local buffers or onto ports at the 900 mm SEMI standard height manually by human operators. The present invention is capable of operation with each of these delivery systems, and further increases delivery flexibility by providing additional locations adjacent the tool for pod delivery, as explained hereinafter.

As previously indicated, the transport and retrieval portion of the SDR system 122 comprises vertical rails 116 mounted to the support structure 110, horizontal rail 118 capable of vertical translation with respect to the vertical rails 116, and gripper 120 capable of horizontal movement along horizontal rail 118. In a preferred embodiment, the horizontal and vertical rails reside in a plane spaced from and adjacent to the area occupied by the shelves, on a side of the shelves opposite the processing tool. However, as explained hereinafter, the rails may be positioned adjacent the processing tool, and the shelves mounted to a wall spaced from the processing tools.

As would be appreciated by those skilled in the art, a pair of drive mechanisms (not shown) may be provided, with the first drive mechanism driving horizontal rail 118 along vertical rails 116, and the second drive mechanism driving the gripper 120 along horizontal rail 118. The drive mechanisms may each preferably include a motor, such as for example a servo or stepper motor, for driving the respective mechanisms. A counterweight (not shown) may be provided as part of the SDR system for balancing the weight of the horizontal rail 118 and gripper 120. Thus, the drive mechanisms responsible for vertical movement of the horizontal rail need only lift the weight of the pods. The counterweight may be provided within an enclosure, located for example on the side walls of the SDR system, to prevent any contaminants from entering into the clean environment.

Additionally, power transmission mechanisms may be provided for transmitting the power from the first and second drive mechanisms to the horizontal rail and gripper, respectively. In one embodiment, a first power transmission mechanism may comprise a timing belt contained within one or both vertical rails 116, to which timing belt the horizontal rail is attached. A second timing belt may be used for driving the gripper horizontally along the horizontal rail 118, which belt is preferably encased within the horizontal rail. As would be appreciated by those of skill in the art, other power transmission mechanisms may be used. The vertical rail encloses power rails in electrical connection with carriages at the end of horizontal rail 118 which provide power to the second drive mechanism on the horizontal rail driving the gripper therealong. The vertical rails also act as vertical guides for the horizontal rail.

Several schemes may be utilized for passing control signals to the drive mechanisms of the horizontal rail gripper. In one embodiment, the control signals may be transmitted to drive mechanisms of both the horizontal rail and gripper over the power rails located in the vertical rails. In an alternative embodiment, infrared (IR) may be used to communicate the control signals from the vertical rail to the gripper drive mechanism on the horizontal mil. In this embodiment, an IR transmitter may be provided adjacent one of the vertical rails, directing the signal vertically to a mirror mounted on the horizontal rail. The mirror is mounted at a 45° angle toward an IR receiver on the gripper drive mechanism. Such a system will operate properly regardless of the vertical position of the horizontal rail, and regardless of the horizontal position of the gripper. It is understood that other known schemes may be utilized for transmitting the control signals to the drive mechanisms.

An exhaust source (not shown) may create a low pressure in the interior of the horizontal and/or vertical rails so that any particulates generated within those rails may be removed from the system, thereby minimizing particulates in the area of the process tools.

As would be appreciated by those of skill in the art, various other locomotion, translation, and power supply systems may be substituted for those described above for accomplishing horizontal and vertical translation of gripper 120. Such systems may include various configurations of a first translation mechanism laid down over a second, orthogonally moving, translation mechanism. Alternatively, systems having a single mechanism capable of X-Z translation may be utilized.

Figure 5:
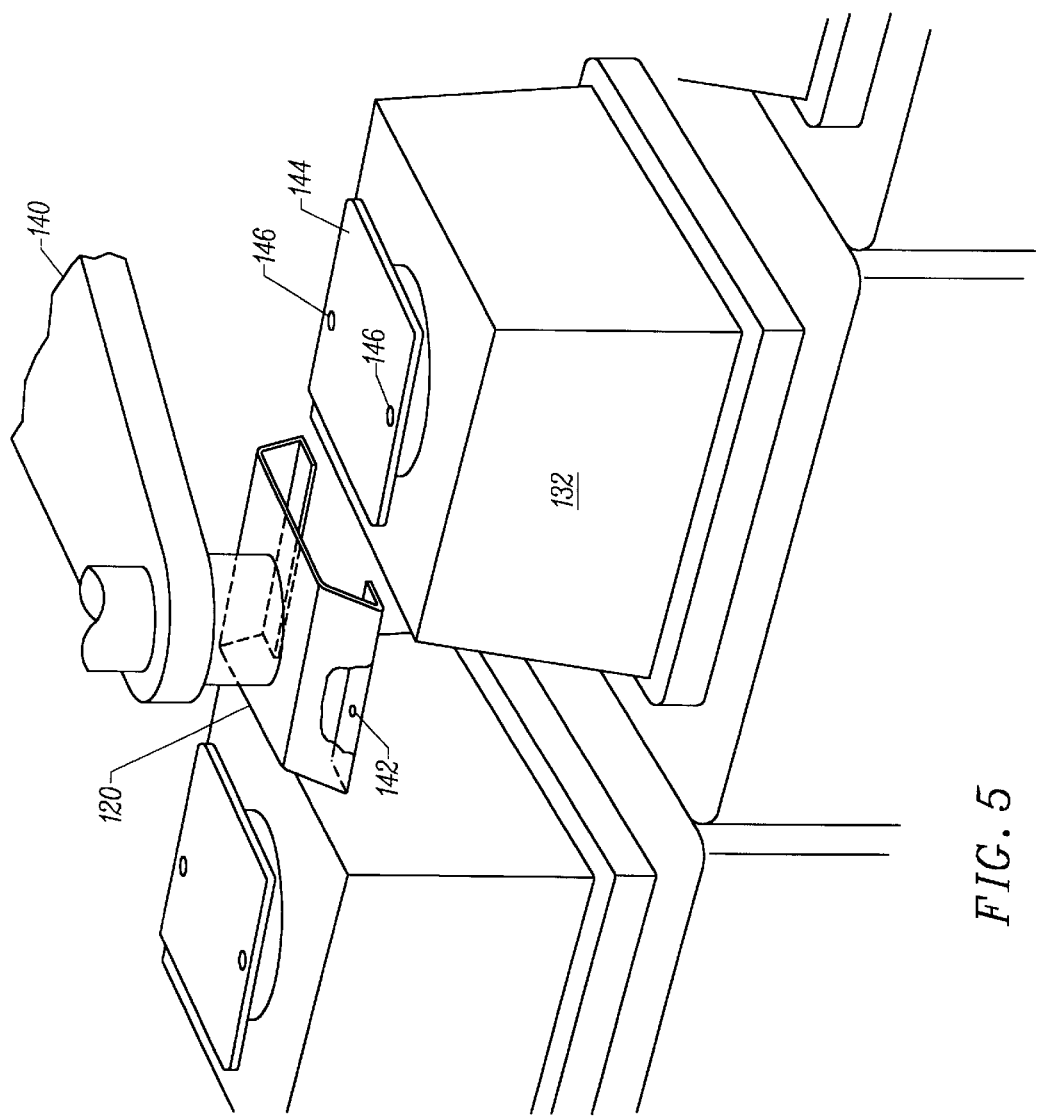
FIG. 5 is a perspective view of a gripper according to the present invention.
Figure 6:
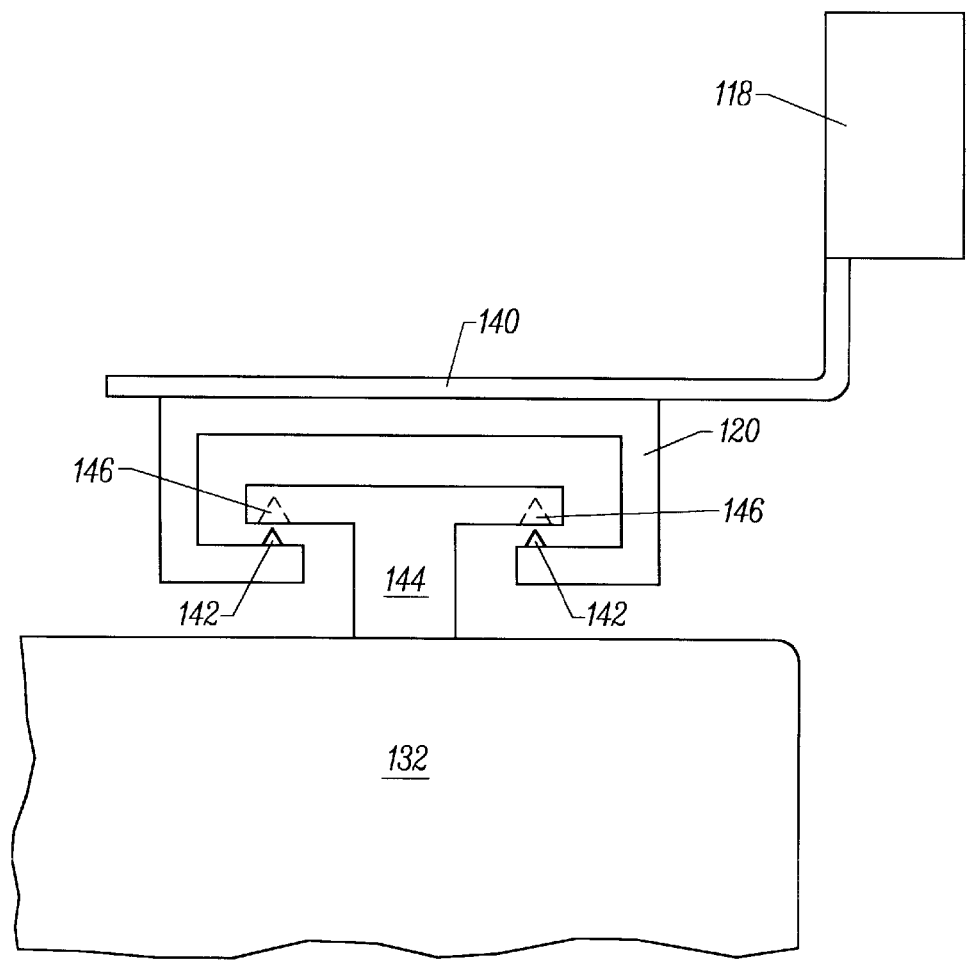
FIG. 6 is a side view of a gripper according to the present invention.

Details relating to the gripper 120 are shown in the perspective view of FIG. 5 and the side view of FIG. 6. An L-shaped bracket 140 mounted to the power transmission mechanism within the horizontal rail 118 extends downward from the horizontal rail and inward into the space occupied by the pods. The gripper is mounted to the bracket 140, and includes pins 142 protruding upward from end sections of the gripper. When viewed from a direction of the horizontal translation along the horizontal rail 118, the gripper 120 includes a substantially "C"-shaped cross section. With such a shape, the gripper is capable of moving horizontally over and around a handle 144 conventionally provided on an upper surface of pods 132. The handle includes detents 146 from mating with pins 134.

In order to grip and transfer a particular pod, a gripper and horizontal rail are moved vertically up or down within a space 113 until gripper 120 is located next to a pod to be retrieved. The gripper 120 is positioned next to the pod at an elevation such that the gripper may next be moved horizontally along the horizontal rail 118 so that the "C"-shaped gripper moves over and around the handle 144, until the pins 142 are substantially vertically aligned with the detents 146. In this position, there is still preferably no contact between the gripper 120 and the handle 144. In a next step, the horizontal rail moves upward along the vertical rails so that the pins 142 engage within the detents 146, and respective surfaces of the gripper and handle lie in contact with each other. Continued upward movement of the horizontal rail 118 along the vertical rails 116 will lift the pod off of its shelf, tool load port, or manual I/O port, and the pod may thereafter be transferred as desired, securely held by the gripper 120.

In certain applications, and for certain pod positions, the gripper may not be able to slide directly horizontally over the pod handle, as the travel path of the gripper to the handle may be obstructed for example by the pod door. For such applications, it is contemplated that the gripper may move horizontally past the pod handle of a pod to be accessed at a height sufficient to clear the pod. Thereafter, the gripper may drop down to the pod gripping elevation, and then move back horizontally to position the gripper over the pod handle. Thus, the gripper according to embodiments of the present invention is capable of approaching and gripping a pod handle from either side of the handle.

Where a gripper 120 is not carrying a pod, the gripper may move horizontally across pod-carrying shelves, with the gripper at the elevation of the pod handles within any given horizontal row. At this elevation, as the gripper moves horizontally, gripper 120 passes around the pod handles without contacting the pod handles or pod.

The gripper and transport system according to the present invention provide several advantages not found in conventional local tool buffers. First, because the gripper is free to move around in the same plane as the pods, and because the rails are thin and may operate directly adjacent the storage shelves, the present invention provides a pod transfer mechanism which does not significantly add to the footprint of the storage shelves. This is in contrast to prior art tool buffers, where the transfer robots take up a significant amount of space. Second, all transport of the pods between the ports and various storage shelves according to the present invention may occur without the pods ever leaving the X-Z plane of the ports and shelves. Thus, the present invention comprises a two-dimensional transport system. This further minimizes the footprint of the present invention. By contrast, prior art tool buffers employ three-dimensional transport systems, in that the pods are transported outside of the X-Z plane in which they are stored. The footprint of such conventional buffers must be large enough to accommodate this three-dimensional transport. A still further advantage to the transport system of the present invention is that the gripper may move horizontally over pod-carrying shelves. Thus for example, where a gripper needs to transport a pod located at the present elevation of the gripper, but three columns over, the gripper may simply translate horizontally over to the pod, as opposed to having to move downward to a clear horizontal pathway, then horizontally, and then back up to the elevation of the pod. This ability of the present invention vastly improves pod transfer times.

As is known in the art, the gripper may include sensors (not shown), occasionally referred to as squat sensors, for preventing a delivery and retrieval mechanism from setting down a pod on a shelf, tool load port, or manual I/O port already having a pod thereon. Although various known configurations are possible, in one embodiment, the squat sensor may be mounted on the gripper 120 to sense the positional relationship between the gripper and a handle 144. If the handle begins to separate from its engagement with gripper 120 prior to a time when a pod is supposed to separate from the gripper, as for example if one pod were being set down on a shelf already having a pod, the sensor is able to detect this initial separation. Thereafter, the computer controlling the mechanism is alerted as to the potential problem and motion of the gripper ceases.

Upon location of a pod at its next destination, the horizontal rail and gripper are lowered until the pod rests on the support surface (shelf, tool load port, etc.). Continued downward motion of the rail and gripper disengage pins 142 from detents 146, to thereby disengage the gripper from the pod handle. Thereafter, the gripper translates horizontally until the gripper is no longer vertically aligned around the handle 144, and is once again free to translate vertically without contacting the handle or pod. In one embodiment of the invention, such as for example that shown in FIGS. 3A through 3C, the rotational orientation of the pod remains the same as it is transferred between shelves 114, tool load port 126, and/or manual I/O port 128. For such embodiments, the gripper 120 may be fixedly mounted to the bracket 140, such as for example shown in FIG. 6. However, for alternative embodiments of the invention, explained hereinafter, it may be that the rotational orientation of the pod needs to be adjusted as the pod is transferred between shelves 114, the tool load port 126, and/or the manual I/O port 128. For such embodiments, the gripper may be rotationally mounted with sect to the bracket 140 such as for example as shown in FIG. 5. As would be appreciated by those of skill in the art, bearings may be provided within the bracket 140 for rotationally supporting the gripper 120, and various drive mechanisms including servo motors, stepper motors, or solenoids may be provided for rotating the gripper with respect to the bracket. The degree of rotation may be controlled by the computer controlling the system. Additionally, or alternatively, the shelves, tool load ports, and/or manual I/O ports, may include mechanisms capable of rotating a pod once located thereon. Details relating to the structure and operation of support surfaces capable of rotating pods located thereon is disclosed in U.S. patent application Ser. No. 08/730,484, entitled ROTATED, ORTHOGONAL LOAD COMPATIBLE FRONT-OPENING INTERFACE, which application is owned by the assignee of the present invention, and which application is incorporated herein by reference in its entirety. While that application relates primarily to rotation of tool load ports, the various pod support surfaces in the present invention, including shelves 114 and embodiments of the platform 156 (explained hereinafter), may be provided with rotating capabilities according to known technology.

As would be appreciated by those of skill in the art, various other known mechanisms may be used instead of gripper 120 to engage, transfer, and disengage pods 132. For example, while the system disclosed above is a passive gripper (in that the gripper itself is of a fixed configuration), an active gripper may be used which includes jaws capable of closing and opening, to thereby grip and release a pod. Moreover, it is understood that the structure and operation of the various gripping mechanisms may vary depending on the configuration of the pod to be gripped and transferred.

Figure 7:
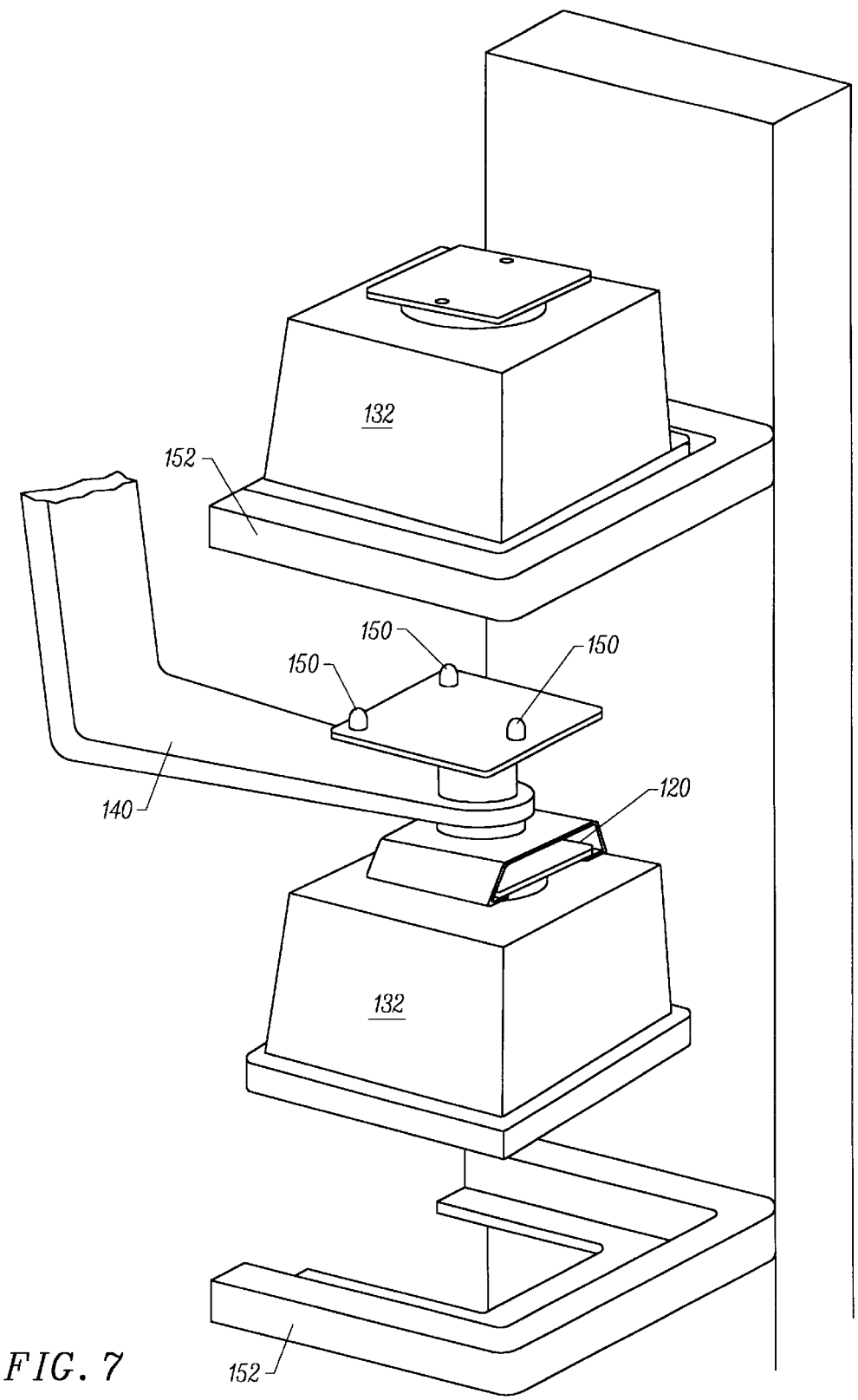
FIG. 7 is a perspective view of a gripping mechanism according to an alternative embodiment of the present invention.

An alternative of one such gripping mechanism is shown in FIG. 7. In such an embodiment, the bracket 140 mounted on horizontal rail 118 (not shown in FIG. 7) and gripper 120 are identical to those components described above. However, in this embodiment, the bracket further includes a plate 148 mounted on a top side of the bracket 140 opposite gripper 120. The plate 148 preferably includes a plurality of autokinematic pins 150. The embodiment of FIG. 7 further includes a plurality of shelves 152, which are similar to shelves 114 with the exception that a central portion of the shelf is cut out so that a pod 132 is supported on the shelf 152 around the lower outer edges of the pod. After a pod 132 has been captured by gripper 120 as described above, horizontal rail 118 may raise the gripper upward until the plate 148 and autokinematic pins 150 contact the underside of the next upper pod 132. As previously indicated, a lower surface of pod 132 includes detents capable of mating with pins 150 so that continued upward movement of the horizontal rail 118 will lift the pod 132 off of shelf 152, with the pod securely held on plate 148 by pins 150. In this way, the transport and retrieval mechanism according to the present invention may transport one or two pods simultaneously, and may grip a pod from its upper surface (by gripper 120) or from its lower surface (by plate 150).

Various systems may be used to identify the position of the gripper 120 as the gripper moves around the SDR system 122, thus allowing the gripper to be positioned at a desired location relative to a pod on a shelf or port. In order to identify the horizontal position of the gripper, one or both of the vertical rails 116 may include indicial marks which are read by sensors on the horizontal rail as the horizontal rail passes thereover, so that the vertical position of the horizontal rail may be known. Such indicial marks may include, but are not limited to, RF emitters, optical fiducials, and mechanical flags. In order to identify the horizontal position of a gripper within the bay, the gripper may include a servo mechanism cooperating with the gripper driving mechanism for measuring how much the gripper has moved horizontally along the horizontal rail. The gripper may initially be referenced at its left or right most position on the horizontal rail, which position is known. Thereafter, the servo mechanism can identify and measure the horizontal movement of the gripper relative to the reference location.

As would be appreciated by those of skill in the art, other known schemes may be used to identify the X and/or Z position of the gripper within the SDR system 122. For example, in a further embodiment of the invention, a conductive strip or coil may be mounted along the length of the gripper, and the gripper may include a conductive finger lying in contact with the strip or coil as the gripper moves along the horizontal rail. The strip or coil and the conductive finger on the gripper may form a portion of an electrical circuit, and the strip or coil may act as a variable resistance element, such that the resistance changes as the distance between a reference end of the variable resistance element and the conductive finger on the gripper changes. The variable resistance values may be mapped to a particular distance of the gripper away from the reference end of the resistance element, thus indicating the position of the gripper along the horizontal rail.

In a further embodiment for identifying the position of the gripper, a beam emitter, such as for example a laser, may be rotationally mounted on the gripper so as to emit a rotating beam in the vertical X-Z plane. A pair of receivers may be provided for example at the base of the SDR system adjacent the vertical rails, which receivers periodically pick up the emitted beam as the beam rotates. By triangulating the angle at which the rotating beam strikes first one receiver and then the other, the position of the gripper may be calculated. This information may be used in a closed loop servo control system, and may also be useful in the event of a power failure, in that the emitter and receiver system continuously identify the position of the gripper.

The portion of the SDR system facing the aisle of the tool bay may include a cover 152 (FIGS. 2, 3A and 3B). Several standards set by SEMI and other organizations relate to preventing conflicts between the automation within a wafer fab and the human operators within the fab; that is, areas where the automated machinery could potentially injure or otherwise interfere with the human operators. The cover 152 minimizes the potential for operator/automation conflicts as a result of the shelves and rails being located entirely behind the cover, out of the way of the operators. The cover 152 preferably includes an access window 154 at the tool load ports and manual I/O port, which window is the only location where moving parts of the present invention (i.e., the gripper and/or a pod held thereby) and an operator may come together in the same space. Thus, the present invention minimizes the danger of injury to and interference with the human operators. The cover 152 may further include panels (not shown) for allowing operators access to portions of the process tool as may be necessary for maintenance and repair. The cover 152 also preferably includes sections formed of a clear material, such as for example plexiglass, so that an operator may look through the cover 152 while manually locating a pod on the tool load port, manual I/O port, or shelf at that elevation. The cover may alternatively be formed entirely of a clear material.

As shown in FIGS. 3A and 3B and as explained above, shelves 114 are mounted to wall 112 and are adjacent to and extend out away from the process tool 124. The gripper 120 mounted on the horizontal and vertical rails is spaced away from the front of the tool a distance slightly greater than the length of the shelves. Thus, as the horizontal rail translates, the rail passes in front of shelves 114 and pods 132, while the gripper 120 extends away from the horizontal rail into the space of the shelves.

In an alternative embodiment of the present invention (not shown), the relative positions of the shelves and gripper may be switched. In this embodiment, the wall 112 may be supported from the ceiling and/or floor, with shelves 114 mounted thereto and extending toward the process tool 124. The vertical and horizontal rails in this embodiment would be positioned adjacent the process tool 124, with the gripper 120 extending away from the process tool into the space occupied by the shelves and pods. Such an embodiment would be used for example, where a conveyor is attached to the front of the SDR system to deliver pods there to, as explained hereinafter. If the horizontal rail was on the aisle side of the shelves, the rail and conveyor would potentially interfere with each other. However, with the horizontal rail on the tool side of the shelves, there is no interference with the conveyor. Where a conveyor is attached to the side of the SDR system to deliver pods thereto, the horizontal rail may be positioned at either the aisle or tool side of the shelves.

In a further alternative embodiment of the invention (not shown), it is contemplated that a single SDR system may include two sets of vertical and horizontal rails, one set on the process tool side of the shelves, and the other set on the aisle side of the shelves. In this embodiment, the shelves may be mounted to a support platform mounted to the floor and/or the ceiling. Each set of rails includes its own gripper, such that two grippers are utilized within the SDR system to store, deliver and retrieve pods. The grippers may be cooperatively controlled by the software control system. It is further contemplated that two horizontal rails and grippers may be mounted on a single pair of vertical rails on either the tool or aisle side of the shelves.

Another feature of the present invention is that the SDR system is scalable. That is, the height and length of the SDR system may be configured to any desired sizes, depending on particular dimensional requirements of the semiconductor manufacturer's tool bay. Additionally, owing to the limitless X-Z positioning of the transport system, the number, size, and spacing of shelves 114 may be scaled as desired. Similarly, the transport system may be scaled as desired simply by changing the length of the vertical and/or horizontal rails. Finally, as explained hereinafter, the control system is easily adapted to control the SDR system regardless of the scale of the system. Once the shelves are positioned within the SDR system, the location of each shelf can be defined in a look-up table in the software control so that the transport system may be accurately positioned with respect to the shelves. Providing the controls with the location of each shelf may be easily accomplished, and no change in the software of the control system is necessary.

It is a further feature of the present invention that wafers within a pod may be preconditioned by an injection of nitrogen, clean air, or other conditioning gas into the pods while the pods are located on shelves 114. Thus, the preconditioning occurs away from the tool load ports, out of the critical path of the wafer processing. Details relating to a system for preconditioning wafers within a pod are disclosed in U.S. patent application Ser. No. 08/678,890, entitled TWO STAGE VALVE FOR CHARGING AND/OR VACUUM RELIEF OF PODS, filed Jul. 12, 1996, which application is assigned to the owners of the present invention, and which application is hereby incorporated by reference in its entirety.

Moreover, where pods are being stored for long periods of time, it may be possible to continuously feed nitrogen or other conditioning gas into each pod on shelves 114. Alternatively, one such shelf may be provided with a gas charging system, and the pods may be cycled around within the SDR system so that each pod is periodically located on the charging shelf.

Figure 8A:
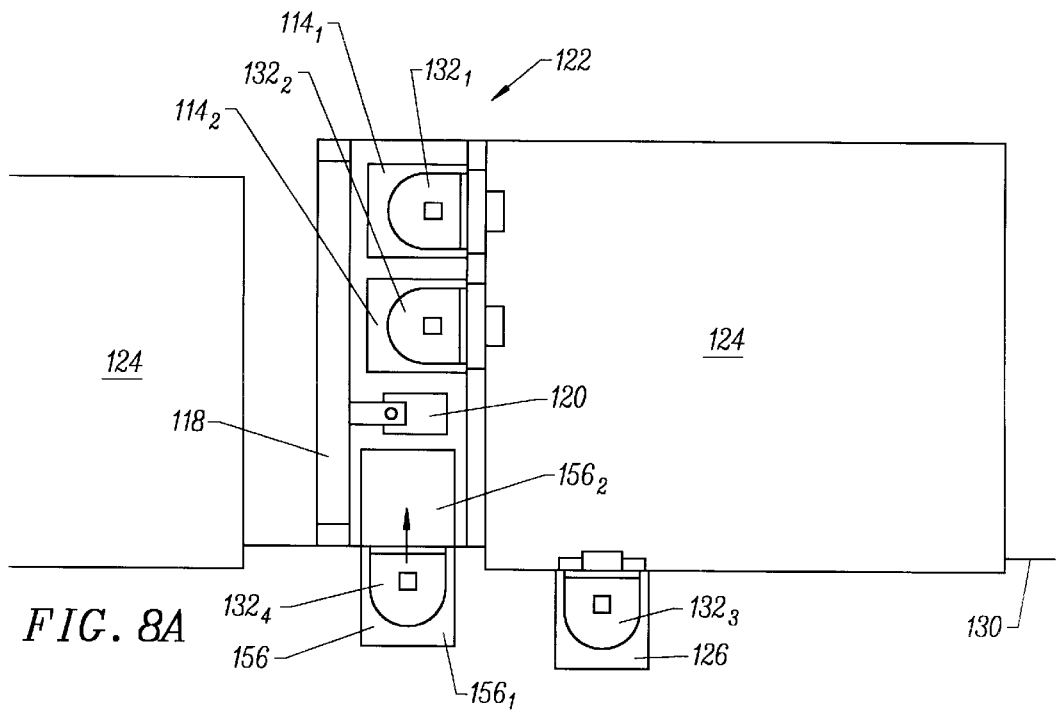
FIG. 8A is a top view of a storage, delivery and retrieval system according to the present invention mounted to the side of a processing tool.

Up to this point, the SDR system 122 has been described as being affixed to a front surface of a process tool. However, referring now to top and side views shown in FIGS. 8A and 8B, respectively, it is understood that the SDR system 122 may alternatively be placed to the side of a processing tool 124 behind the tool bay wall 130, in between adjacent processing tools 124. Referring to the top view shown in FIG. 8A, there is shown pod $132_1$ and pod $132_2$ mounted on shelves $114_1$ and $114_2$. FIG. 8A further shows a pod $132_3$ mounted on a tool load port 126 and a pod $132_4$ positioned on an active platform 156. As previously explained, pods, such as for example pods $132_3$ and $132_4$ may be brought to the process tool 124 and SDR system 122 by various systems including manually, via overhead delivery system, conveyor, or by guided vehicle. Once located on the active platform 156, the pod $132_4$ is preferably brought into the SDR system 122 by the platform, and thereafter positioned on a shelf 114 or tool load port 126 (not shown in FIG. 8A) located on the side of the process tool. As indicated, the pod may be brought into the SDR system in an improper orientation for positioning on the tool load ports. The pod may therefore be reoriented as desired by having a rotating gripper 120 and/or rotating support surface as described above.

The pod $132_4$ positioned on active platform 156 may be brought into the SDR system 122 according to various known schemes. For example, platform 156 may comprise a conveyor capable of moving a pod from a position at $156_1$ in the direction of the arrow to a position $156_2$. Thereafter, the pod may be manipulated by the X-Z transport system as described above. Alternatively, platform 156 may comprise stacked shelves, one or more of which being capable of extending from a retracted position at $156_2$ to an extended position at $156_1$ to receive a pod thereon. Where platform 156 comprises a conveyor, two pods may be located on the conveyor (i.e., one at position $156_1$ and a second at $156_2$). Where the platform 156 comprises an extending/retracting shelf, for example, an upper shelf of the platform may extend to receive a pod and then retract. Thereafter, a lower shelf of the platform 156 may extend to receive a second pod.

This embodiment has the advantage of providing a local tool buffer for a plurality of pods, which buffer is located behind the tool bay wall. It is understood that a platform 156 described with respect to FIGS. 8A and 8B may also be included as part of any of the previously described embodiments of the invention and any of the embodiments of the invention described hereinafter.

In a preferred embodiment, the process tool 124 is substantially flush with the tool bay wall 130, and the load ports, manual I/O port, and SDR system lie in a space in front of the tool. In this configuration, for example, the overhead delivery system may lower a pod to a shelf 114, or a port. However, in alternative embodiments of the invention, the shelves and ports may not be aligned with the conventional overhead delivery system. For example, as the SDR system integrates to the process tool, it is contemplated that the process tool and SDR system be moved back, so that the front of the SDR system is flush with the bay wall (and the front of the process tool is behind the wall).

In this embodiment, it is necessary to have an extended shelf or conveyor which extends outward into the bay to receive a pod where the overhead delivery system is looking to deliver it. If it is located at the 900 mm elevation, the shelf or platform may be fixed in an extended position (as pods are not delivered to the tool or SDR system below that elevation). Either an extended shelf or conveyor would work in this instance. If it is located above the 900 mm elevation, the shelf should be retractable so as to extend when receiving a pod, but to retract thereafter so as not to interfere with subsequent delivery to lower positions, and so as not to interfere with the horizontal rail in embodiments where the rail is located on the aisle side of the shelves. Similarly, for the embodiment of the invention shown in FIGS. 8A and 8B, where the SDR system is located on the side of the tool behind the bay wall, a shelf may extend outward into the bay to receive a pod where the overhead delivery system is looking to deliver it. Again, if the extended shelf is above 900 mm, it must be retractable to allow delivery to positions below. After the shelf or conveyor receives the pod, it may be brought into the SDR system and transported as previously described.

Figure 8B:
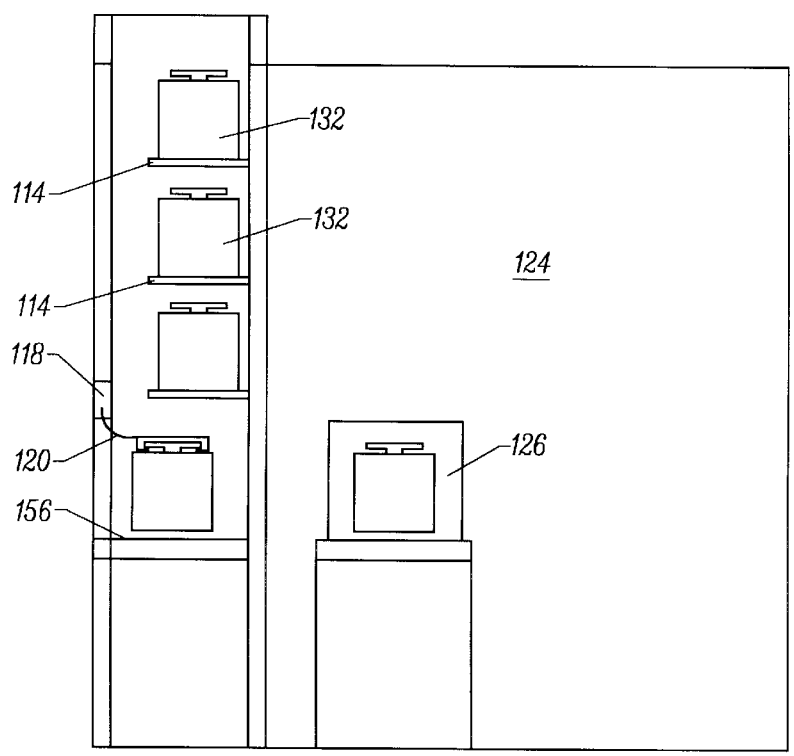
FIG. 8B is a front view of the storage, delivery and retrieval system shown in FIG. 8A.
Figure 8C:
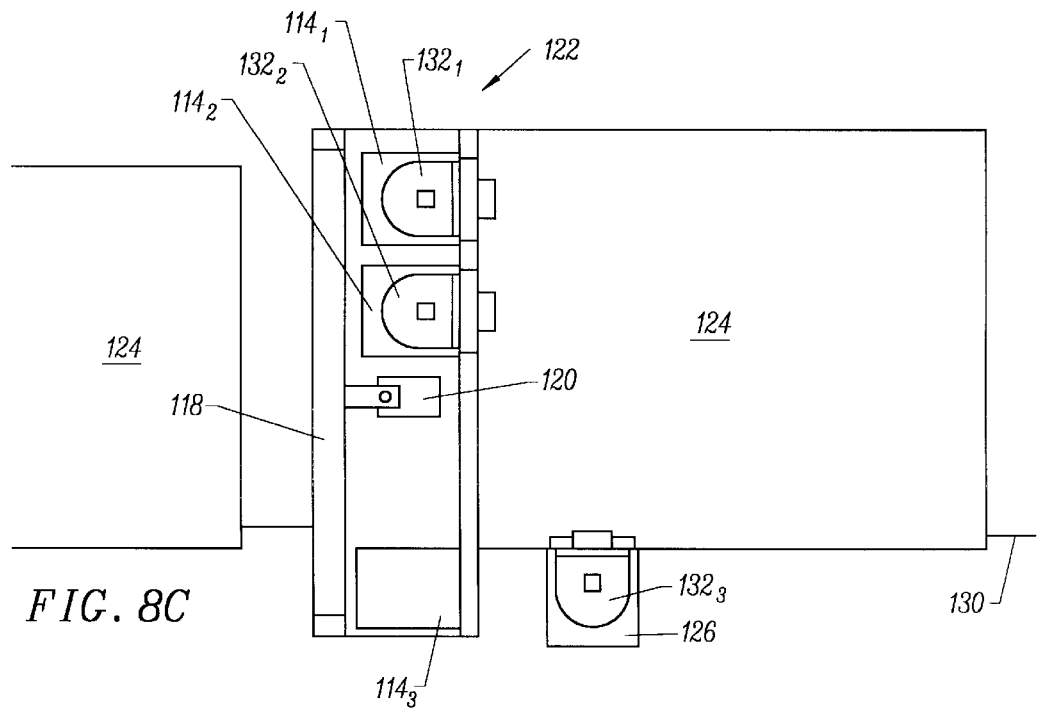
FIG. 8C is a top view of a storage, delivery and retrieval system according to the present invention mounted to the side of a processing tool and extending into the process tool bay.

As indicated above, the SDR system shown in FIGS. 8A and 8B is located entirely behind the bay wall 130. As shown in the alternative embodiment of FIG. 8C, it is further contemplated that the position of the SDR system remains parallel to the side of the process tool, but that it extend a distance of approximately one pod width into the tool bay. Thus, pods may be delivered to and retrieved from shelf $114_3$ on the portion of the SDR system positioned on the tool bay side of the wall 130. The standard delivery mechanisms (overhead transport, conveyor, guided vehicle, etc.) may be used to deliver and retrieve the pod from the shelf $114_3$. Pods may also be transferred around within the SDR system as described above, including moving pods between the portion of the SDR system in the tool bay and the portion of the SDR in the chase. Pods may also be transferred between the portion of the SDR system in the chase and the process tool 124.

An advantage to the SDR system according to the present invention, whether located on the front of the tool or to the side of the tool, is that the SDR system does not add to the depth (for front oriented systems) or width (for side oriented systems) of the process tool. In conventional process tools, the tool load port sticks out from the front and/or side of the tool a distance at least as great as the pod depth, thus enabling the tool load ports to accept pods thereon. Preferred embodiments of the present invention are configured to fit over, or to envelop, the load ports without adding to the depth of the load ports or process tool. This is another feature allowing the present invention to provide local tool buffering without appreciably adding to the footprint of the process tool.

Figure 9A:
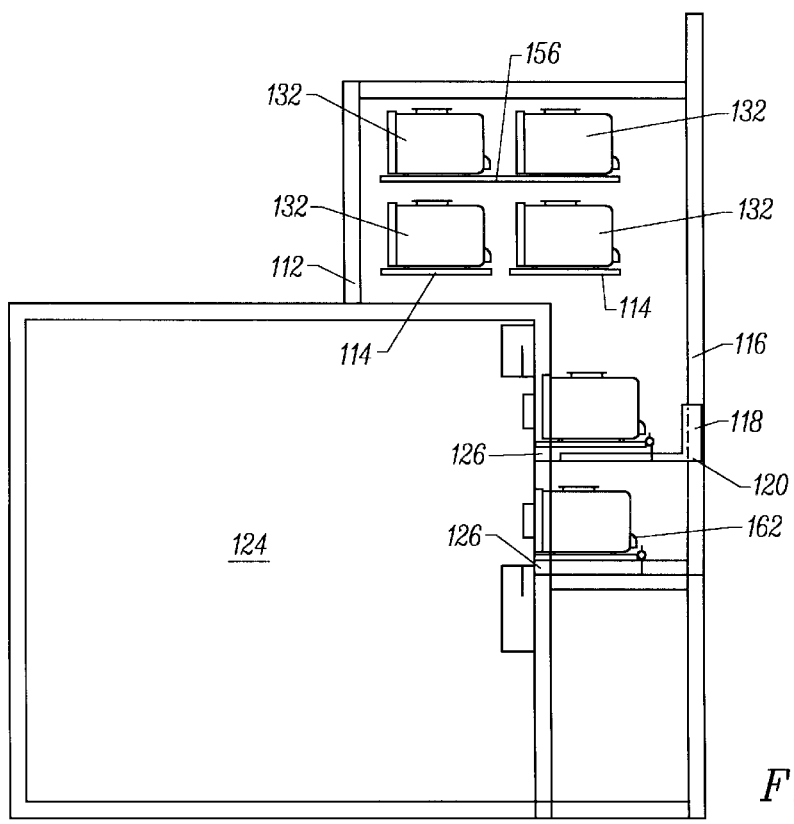
FIG. 9A is a cross-sectional side view of a storage, delivery and retrieval system according to the present invention mounted to the front of a processing tool and having a two deep shelf configuration.
Figure 9B:
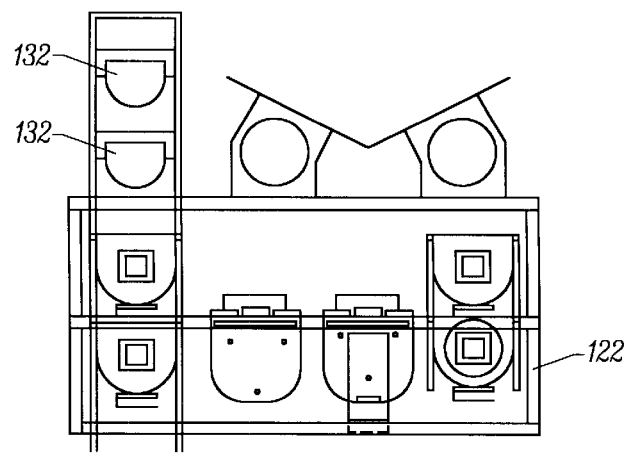
FIG. 9B is a top view of a storage, delivery and retrieval system according to the present invention mounted to the front of a processing tool and including a two deep configuration and conveyor mounted thereto.
Figure 9C:
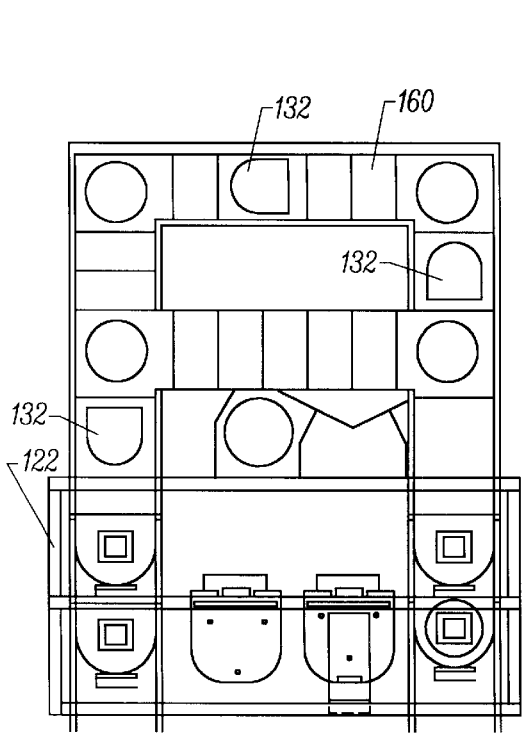
FIG. 9C is a top view of a storage, delivery and retrieval system according to the present invention mounted to the front of a processing tool and including a two deep configuration and conveyor mounted thereto.
Figure 9D:
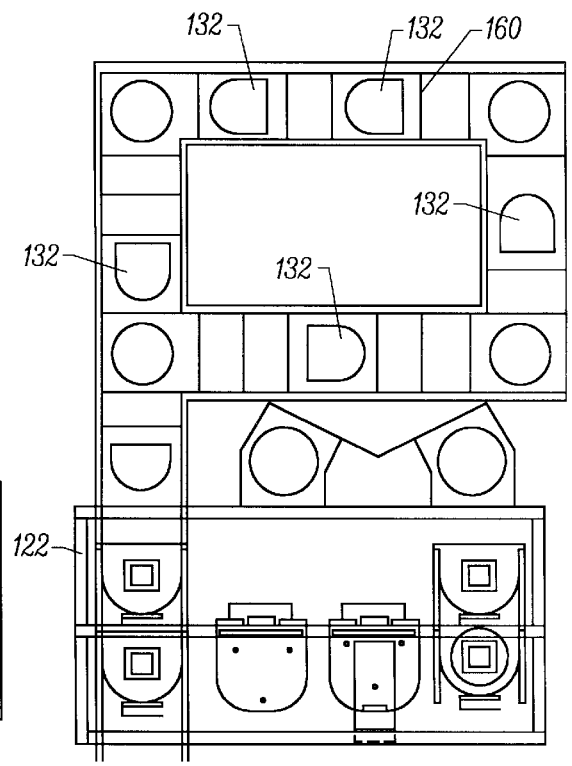
FIG. 9D is a top view of a storage, delivery and retrieval system according to the present invention mounted to the front of a processing tool and including a two deep configuration and conveyor mounted thereto.

Up to this point, the invention has been described as including a plurality of shelves located above and to the sides of each other, i.e., lying one deep from the perspective of the X-Z plane. Referring now to the side view of FIG. 9A, according to an alternative embodiment of the invention, the SDR system may include a plurality of shelves stacked two deep with respect to the X-Z plane. As shown in FIG. 9A, a first layer of pods 132 are stored in a first X-Z plane over a pair of vertically stacked tool load ports 126. A second pair of pods 132 are stored in unused space over the process tool 124. Thus, as indicated for the previous embodiments, the embodiment of FIG. 9A may provide local buffering without significantly adding to the existing footprint of the process tool. In order for gripper 120 to access the rear pods (i.e., those pods located over the process tool), the forward pods must first be removed and repositioned. As previously indicated, gripper 120 is mounted on horizontal rail 118 which in turn rides on vertical rails 116. Therefore, in one embodiment of the invention, in order for gripper 120 to access the rear pods, gripper 120 may include telescoping members which allow the gripper to extend rearward into a position where it may grasp the rearward pods. In such an embodiment, the pods may be supported on shelves as described above and as shown supporting the lower pair of pods in FIG. 9A. In this embodiment, the shelves may be combined as one long shelf mounted from the rear wall 112, or two separate shelves mounted in the side of the SDR system and extending inward toward the middle of the system (e.g., into the page of FIG. 9A).

In an alternative embodiment of the invention shown in FIG. 9A, gripper 120 may not be a telescoping mechanism, and instead the pods 132 may be supported on platform 156 as described above with respect to FIGS. 8A and 8B and as shown supporting the upper pair of pods in FIG. 9A. As in FIGS. 8A and 8B, platform 156 may comprise a conveyor capable of moving a pod rearward to the rear position and forward from the rear position. Alternatively, platform 156 may comprise stacked shelves with the rearward shelf capable of extending to receive and present a pod to the gripper 120 and capable of retracting to its rearward position to store the pod. While the embodiment of FIG. 9A shows a mixed configuration where the lower pods are stored on a pair of stationary shelves that operate with an extending gripper, and the upper shelves are stored on a translating platform operating with a fixed position gripper, a preferred embodiment comprises either the fixed shelves 114 or the platform 156.

Although a preferred embodiment occupies only unused space over the process tool, it is understood that the rows may extend into the aisle of the tool bay instead of or in addition to occupying unused space over the process tool. Moreover, it is understood that the embodiment of the invention may include more than two rows deep from the perspective of the X-Z plane. As shown in the top view of FIG. 9B, in embodiments where the platform 156 comprises a conveyor, the conveyor may be extended backward a relatively large distance into the chase, or forward into the tool bay (depending on its elevation). Additionally, as shown in the top view of FIG. 9C, the conveyor 156 may be made part of a conveyor loop, which loop is capable of storing pods 132. When a particular pod stored in the loop needs to be accessed by the system, the loop rotates until the desired pod is again located on the conveyor 156, which may then present the pod for transfer. Finally, as shown in the top view of FIG. 9D, the conveyor loop may include more than one platform 156.

It is contemplated that the embodiments of the invention shown in FIGS. 9A–9D may be combined with the previously described embodiments, such as for example the side-mounted SDR system of FIGS. 8A and 8B, and also with the embodiments described hereinafter.

Up to now, the SDR system has been described as gripping a pod handle for transporting the pods around within the buffer. In an alternative embodiment of the invention, it is contemplated that the gripper of the SDR system be used to grip and carry away the pod cover once the cover has been separated from the pod base while the pod is located on a load port. In this embodiment, the load port may include telescoping side panels to create a mini-environment substantially isolating to the cassette once the pod cover is gripped and separated from the pod base. Details relating to such a system are disclosed in U.S. patent application Ser. No. 08/730,643 entitled LOAD PORT OPENER, filed Oct. 11, 1996, which application is assigned to the owner of the present invention, and which application is incorporated herein by reference in its entirety. A shelf may be provided to receive the pod top from the gripper to free the gripper for other operations.

Multiple Storage, Delivery and Retrieval Systems on Single Process Tool

Up to this point, the invention has been described as comprising a single SDR system on a single process tool. However, in the embodiments described with respect to FIGS. 10A–11B, the invention comprises a multiple SDR system mounted on a single process tool. Elements having the same function and operation as in the above-described embodiments are given like reference numerals.

Figure 10A:
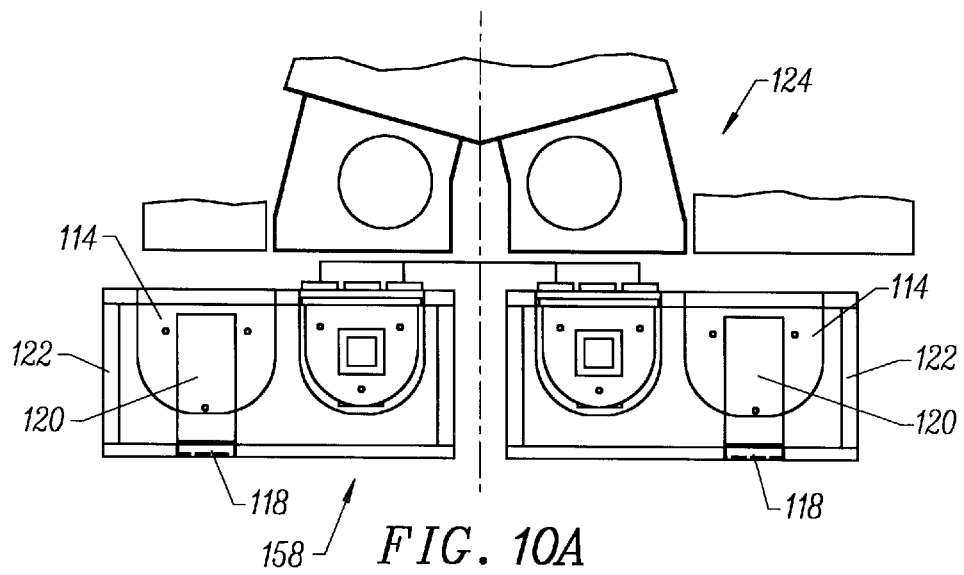
FIG. 10A is a top view of a multiple side-by-side storage, delivery and retrieval system according to the present invention mounted to the front of a processing tool.
Figure 10B:
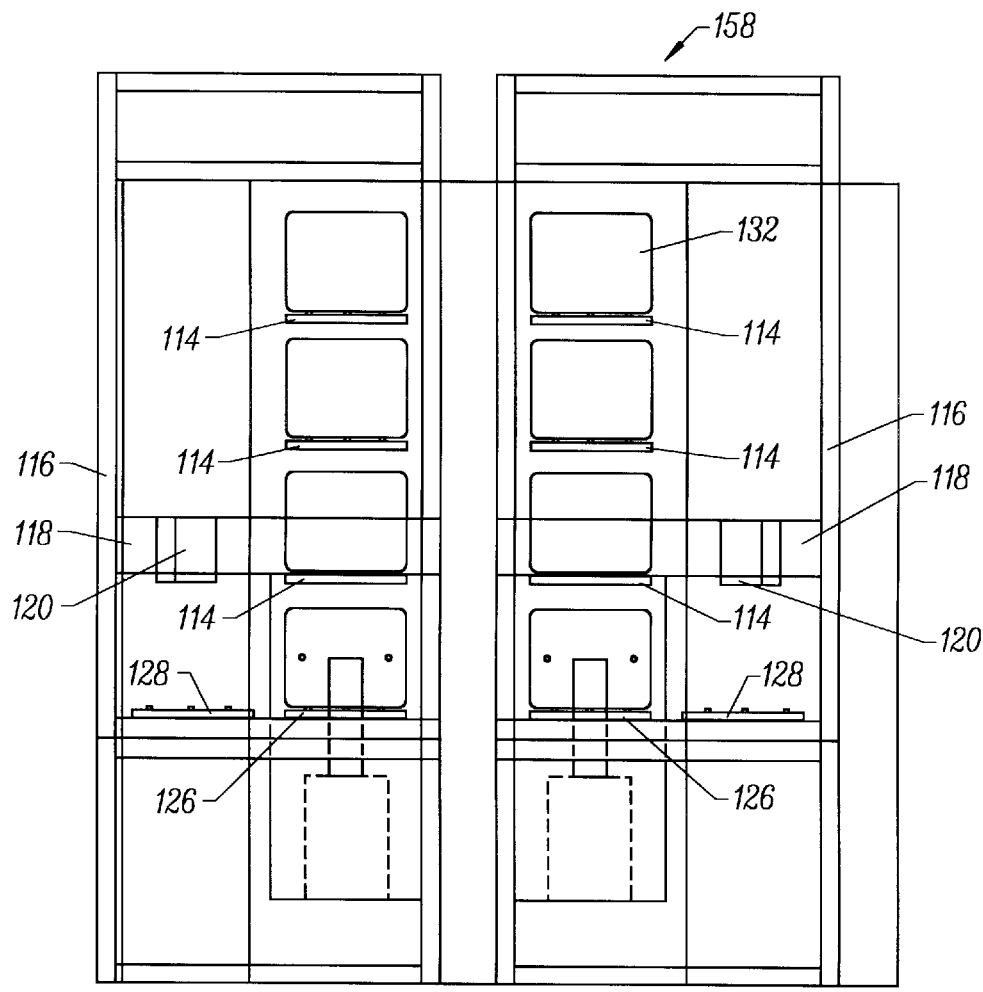
FIG. 10B is a front view of the multiple side-by-side storage, delivery and retrieval system shown in FIG. 10A.
Figure 10C:
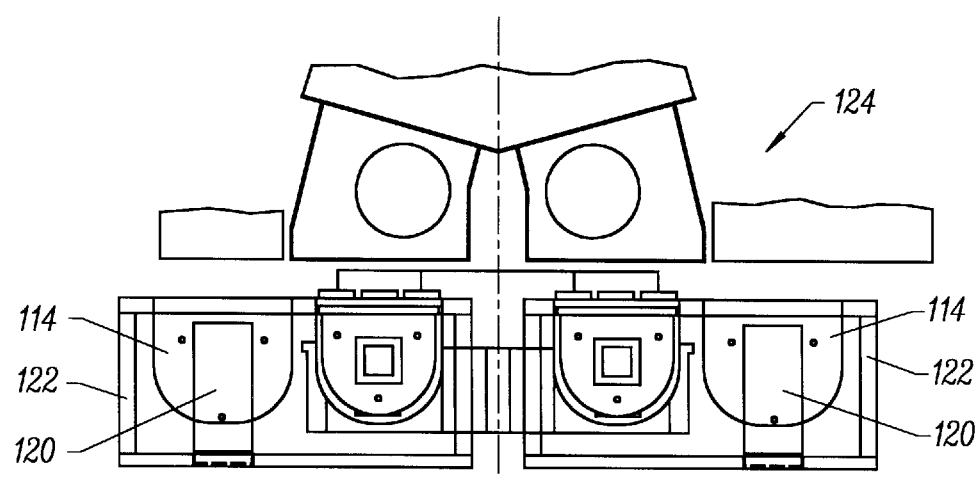
FIG. 10C is a top view of a multiple side-by-side storage, delivery and retrieval system according to the present invention mounted to the front of a processing tool and including a conveyor connecting the two individual systems.

Referring now to top view of FIG. 10A and the front view of FIG. 10B, there is shown a multiple SDR system 158 mounted proximate a process tool 124. The multiple SDR system 158 may comprise a pair of SDR systems 122, mounted side-by-side, each of which systems 122 being identical to embodiments of the SDR system 122 described above. Each SDR system may include a plurality of shelves 114 for storing a plurality of pods 132, and an X-Z transport system comprising a gripper 120 translationally mounted on a horizontal rail 118, which rail is in turn vertically mounted on a pair of vertical rails 116. The two SDR systems of the multiple SDR system are cooperatively controlled by the control software such that each may supply wafers to and receive wafers from the process tool at alternating intervals. Of course, it could be that one system 122 supplies pods to the process tool, while the other system 122 receives pods from the process tool. The embodiment of the invention shown in the top view of FIG. 10C is similar to the embodiments of FIGS. 10A and 10B, with the addition of a conveyor 160 for transferring pods between the two SDR systems 122 of the multiple SDR system 158. In this embodiment, the conveyors enters into the respective SDR systems though the sides of the systems. One or more SDR systems, on the same tool or different tools, may be linked together via a length of conveyor extending between the SDR systems. In such embodiments, one end of the conveyor may be positioned in the place of a shelf in the first SDR system to receive a pod from the gripper 120 of the first SDR system. The opposite end of the conveyor may be positioned in the place of a shelf in the second SDR system to allow the gripper 120 of the second SDR system to retrieve the pod. While FIG. 10C shows the conveyor extending one shelf length into the sides of the SDR system, it is understood that the conveyor 160 may extend into the SDR systems more than one shelf length. The elevation of the conveyor may vary in alternative embodiments, but it is preferably high enough not to interfere with the human operators in the bay. Of course, pods may also be transferred between the adjacent SDR systems by the overhead delivery systems or guided vehicles.

Figure 11A:
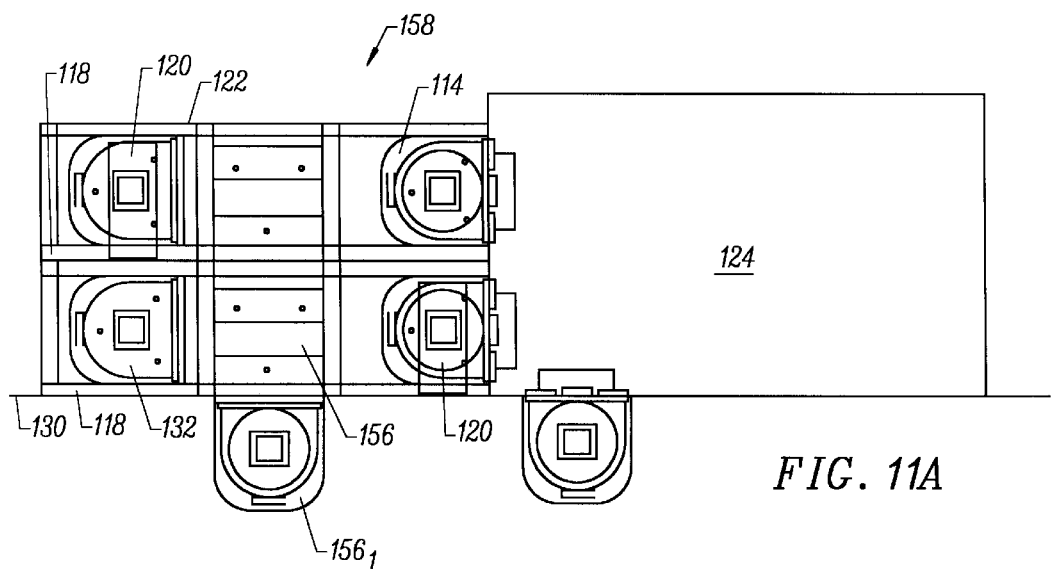
FIG. 11A is a top view of a multiple back-to-back storage, delivery and retrieval system according to the present invention mounted to the side of a processing tool.
Figure 11B:
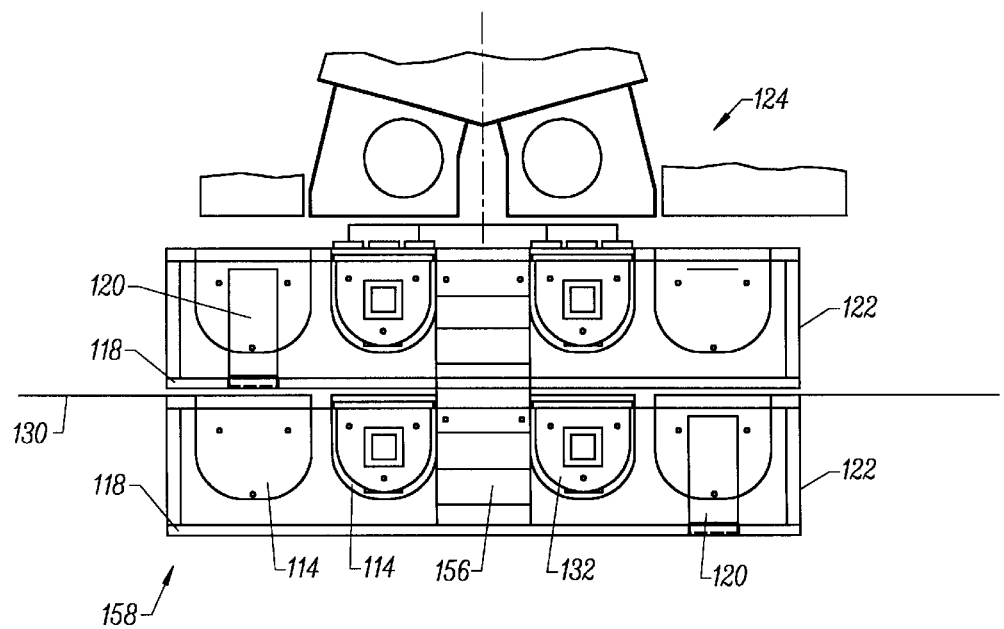
FIG. 11B is a top view of a multiple back-to-back storage, delivery and retrieval system according to the present invention mounted to the front of a processing tool.

Referring now to top views of FIGS. 11A and 11B, there are shown two further embodiments of a multiple SDR system 158 mounted proximate a process tool 124. The multiple SDR system 158 in both FIGS. 11A and 11B may comprise a pair of SDR systems 122, mounted back-to-back, each of which systems 122 being identical to embodiments of the SDR system 122 described above. Each SDR system in both FIGS. 11A and 11B may include a plurality of shelves 114 for storing a plurality of pods 132, and an X-Z transport system comprising a gripper 120 translationally mounted on a horizontal rail 118, which rail is in turn vertically mounted on a pair of vertical rails 116. The individual SDR systems 122 may be cooperatively controlled via the control system to transfer the pods between the tool load ports of the process tool 124 and the shelves within the multiple SDR system 158.

The embodiment of FIG. 11A is similar to the embodiment of FIGS. 8A and 8B where the SDR system is mounted on the side of the process tool, with the modification that the embodiment of FIG. 11A includes a pair of the back-to-back systems 122. Pods may be loaded onto and retrieved from platform 156 at a location $156_1$ either manually, by overhead delivery systems, by conveyor, or by guided vehicle. Once a pod is loaded onto platform 156 at location $156_1$, the platform may bring the pod into the forward SDR system 122 (i.e., the system 122 nearest the bay wall 130), and/or the rear SDR system 122. As above, platform 156 may comprise a conveyor capable of rotating forward or backward to move a pod between the forward and rear SDR systems and the position $156_1$. Similarly, the platform 156 may comprise two or more stacked shelves, one or more of which being capable of extending and retracting so as to move a pod positioned thereon between the forward and rear SDR systems and the position $156_1$. One or both of grippers 120 in the multiple SDR system 158 of FIG. 11A may preferably be capable of rotating a pod so as to rotate it from its initial orientation shown at position $156_1$ to its final orientation within the system, and visa-versa. Alternatively or additionally, where platform 156 comprises two or more shelves, the shelves may be capable of rotating the pod.

The embodiment of FIG. 11B is similar to the embodiment of FIGS. 3A–3C where the SDR system is mounted on the front of the process tool, with the modification that the embodiment of FIG. 11B includes a pair of the back-to-back systems 122. In this embodiment, the tool and SDR system are set back so that only the front SDR system protrudes past bay wall 130 into the tool bay. This results in a net footprint increase of only the rear SDR system. A pod may be transferred to or from one of the shelves 114 in the front SDR system either manually, by overhead delivery systems, by conveyor, or by guided vehicle. Where a pod has been loaded into the multiple SDR system 158 of FIG. 11B, the pod may thereafter be stored in the front SDR system, or transferred to the rear SDR system via the platform 156. Again, the platform 156 of this embodiment may comprise either a conveyor or stacked shelves capable of extending and retracting. Once in the rear SDR system, the pods may again be stored or transferred to the tool load port. Upon completion of processing on a particular lot of wafers, the subject pod may be transferred from the tool load port to a shelf in the rear SDR system, or to a shelf in the forward SDR system via the conveyor 156. Although not shown, it is contemplated that the multiple SDR systems of FIGS. 11A and 11B may include more than one conveyor 156 for transferring pods between the two individual SDR systems. It may be desirable in the embodiments of FIGS. 11A and 11B to locate the horizontal rail on the tool side of the shelves in the rear SDR system and in the aisle side of the shelves in the forward SDR system. That way, the horizontal rail cannot interfere with the conveyors shuffling pods between the front and rear SDR systems.

Single Storage, Delivery and Retrieval Systems on Multiple Process Tools

It is another feature of the present invention to allow tools to be joined together by the SDR system 122, so as to facilitate the transfer of pods between these tools. For example, it would be advantageous to link together a process tool and a metrology tool responsible for testing wafers prior to entry into that process tool, or upon exit from that process tool. Similarly, it would be advantageous to link together certain process tools, such as for example a wet station and a furnace, so that wafers from the wet station may be passed quickly via the SDR system to the furnace to minimize native oxide growth. Moreover, it would be advantageous to link together two of the same process tools. Thus, if one went inactive, pods scheduled for that tool could be rerouted via the SDR system to the active tool.

Figure 12:
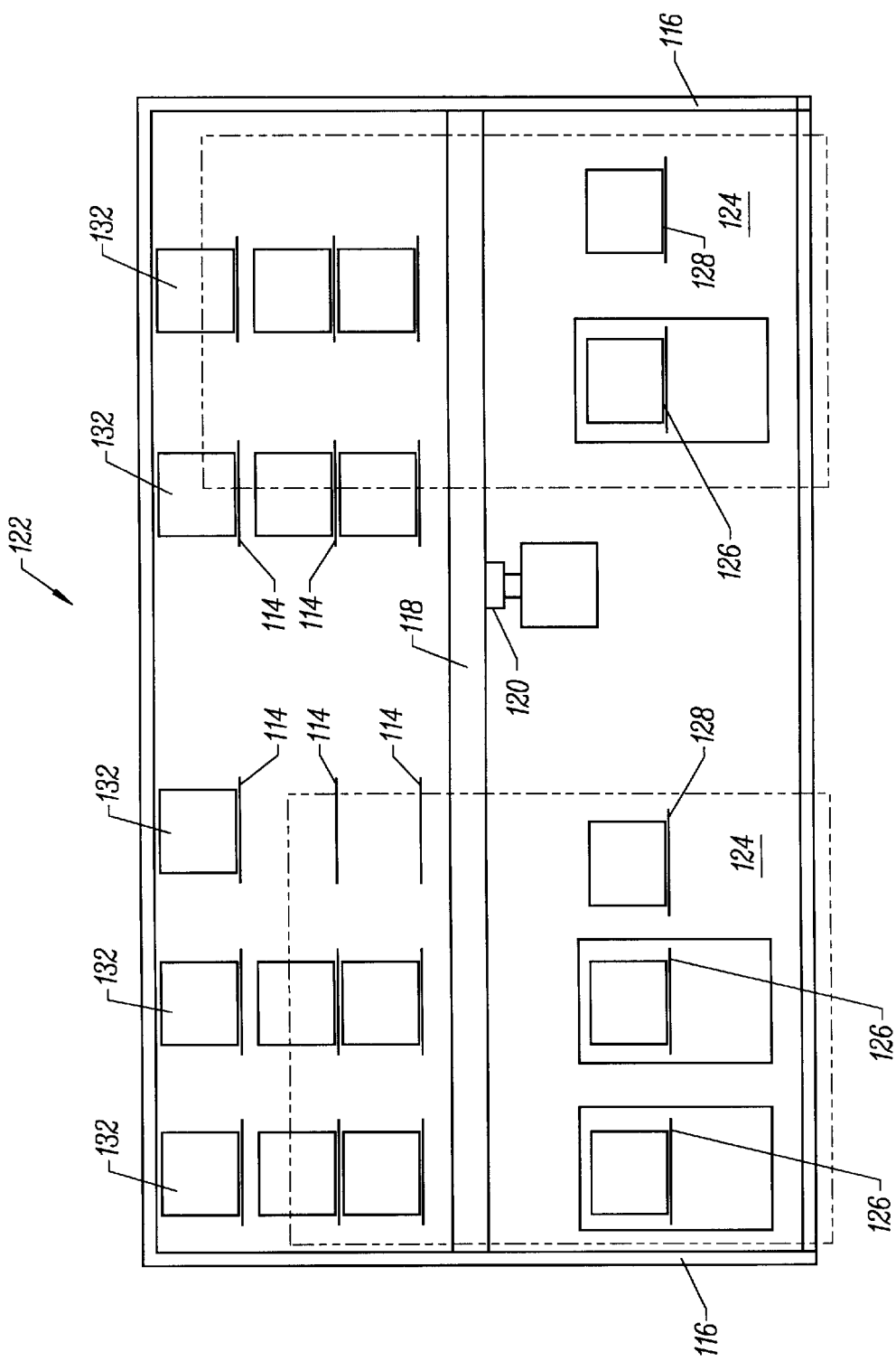
FIG. 12 is a front view of a storage, delivery and retrieval system according to the present invention servicing more than one processing tool.

An embodiment of the present invention providing these advantages is shown in the front view of FIG. 12. The embodiment of FIG. 12 is similar to the embodiment of FIGS. 3A–3C where the SDR system is mounted on the front of the process tool, with the modification that the embodiment of FIG. 12 includes a single SDR system 122 that is scaled to service two adjacent process tools 124. As in the above embodiments, the SDR system of FIG. 12 may include a plurality of shelves 114 for storing a plurality of pods 132, and an X-Z transport system comprising a gripper 120 translationally mounted on a horizontal rail 118, which rail is in turn vertically mounted on a pair of vertical rails 116. The control software may control the operation of the X-Z transport system to transfer pods between the shelves and ports of both tools as needed. Although the description of FIG. 12 has been with respect to two process tools, it is understood that this embodiment is equally applicable to a process tool and metrology tool. It is further understood that the embodiment of FIG. 12 may be combined with embodiments of the invention described above, such as for example the back-to-back multiple SDR system 158 of FIG. 11B, and embodiments of the invention described hereinafter.

In certain instances, process and/or metrology tools may be stacked on top of each other. It is further contemplated that the SDR system according to embodiments of the present invention would be sized to service the stacked tools, and to transport pods between the respective stacked tools and storage shelves of the SDR system.

A Storage, Delivery and Retrieval System as a Stand-Alone Stocker

Figure 1A:
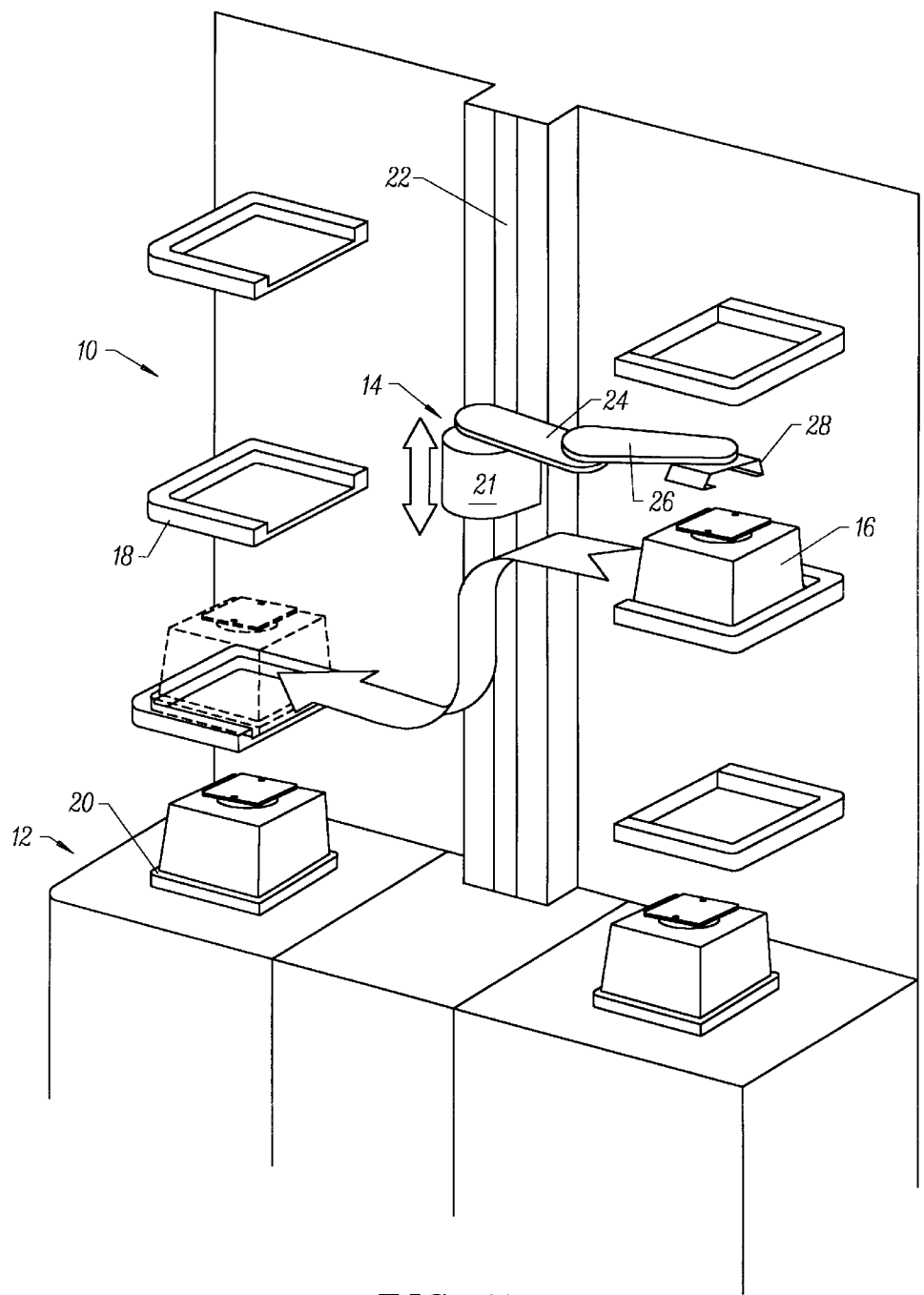
FIG. 1A is a perspective view of a conventional local tool buffer for storing and transporting a plurality of pods.

As set forth in the Background of the Invention section, tool bays typically include stockers capable of storing a plurality of pods. Rectilinear stockers, such as shown in FIG. 1A, typically include a bank of storage shelves and a robot in front of the shelves for transferring pods to and from the shelves. Occasionally, another bank of storage shelves are added juxtaposed to the first bank, with the robot in the middle transferring pods to and from both banks of shelves. As explained in the Background of the invention section, such rectilinear stockers have several shortcomings. For example, each column of storage shelves must be immediately adjacent the transport robot, and such units are limited to having two columns of shelves in any given plane. The robot is incapable of reaching remote shelves. Additionally, rectilinear stockers require a relatively large amount of space, owing to the facts that the robot requires its own space, and the robot is a three-dimensional transport mechanism.

As a stand-alone stocker, the present invention is able to solve these problems of the prior art. As the gripper is capable of accessing any point in the variable size SDR system, the system may be provided with a large and variable number of columns in the plane of the system. Moreover, the stocker according to the present invention is able to provide comparable storage capacity to conventional rectilinear stockers, but does so in a smaller footprint. As shown for example in FIG. 2, the present invention comprises a bank of storage shelves 114 occupying substantially the same space as the storage shelves in rectilinear stockers. However, as the X-Z transport system substantially envelops and overlies the shelves, the present invention is capable of transporting pods to and from the shelves in a much smaller footprint than conventional pod handling robots. In one embodiment, the transport system may add as little as approximately three inches to the depth of the shelves. Another feature of the stocker according to the present invention is that the pods remain stationary while stored in the stocker. Some conventional stockers provide a carousel-type system wherein the pods circulate until the pod to be accessed is rotated into the transport position. Such systems are susceptible to vibration, which may in turn generate particulates on the wafers. Owing to the stationary storage positions in the SDR system, this is not a concern in the present invention.

Figure 1B:
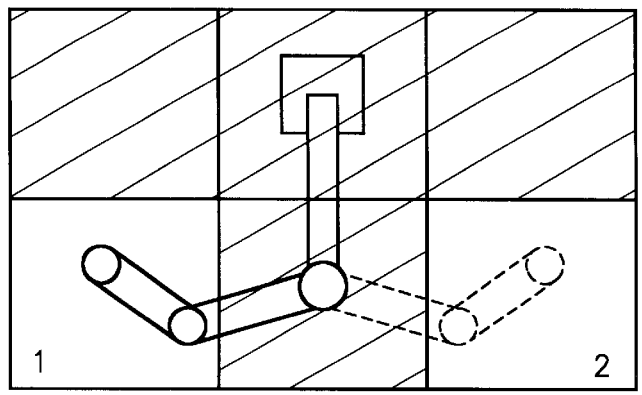
FIGS. 1B–C are graphical representations of the storage density in a prior art storage and transport device.
Figure 1C:
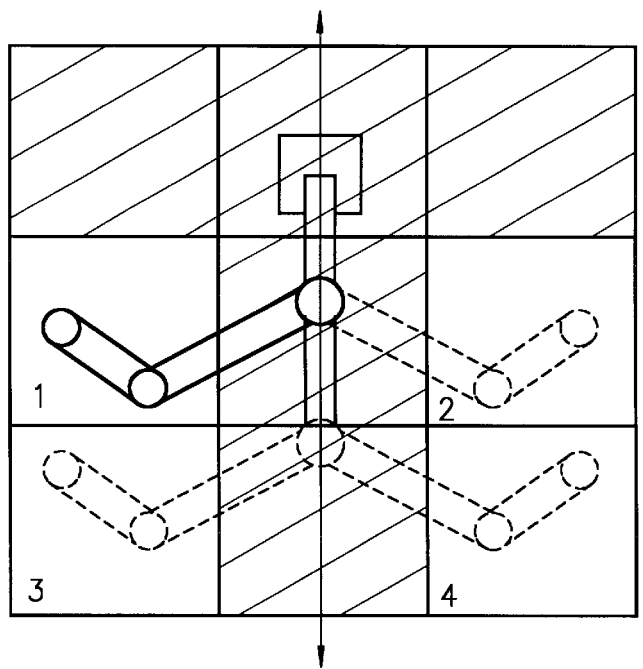
Figure 13A:
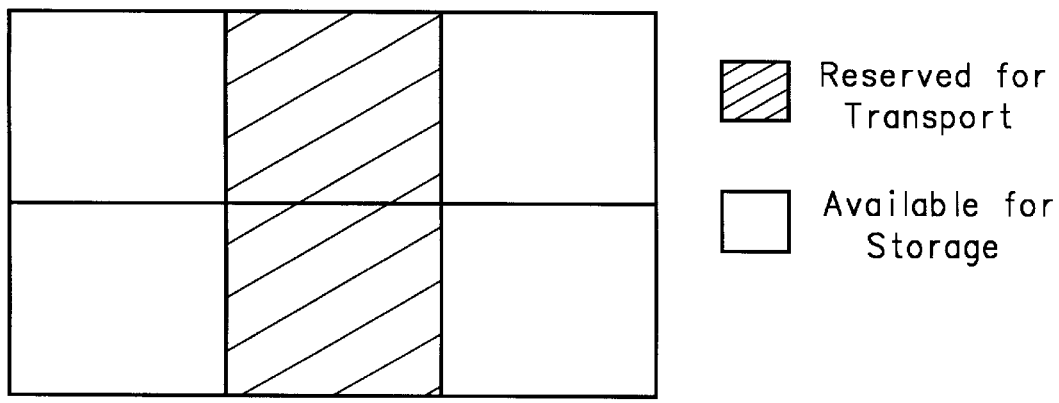
FIG. 13A is a graphical representation of the storage density in a stocker according to the present invention.
Figure 13B:
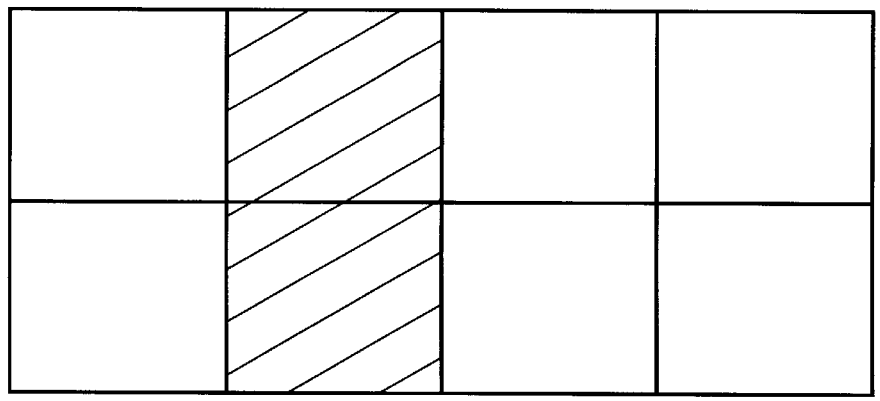
FIG. 13B is a graphical representation of the storage density in a stocker according to an alternative embodiment of the present invention.
Figure 13B:
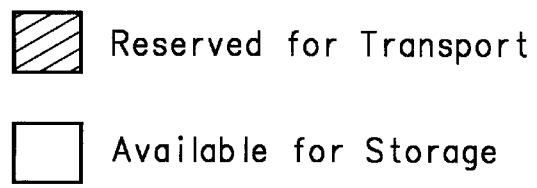

It is a further advantage of the stand-alone stocker according to the present invention that it provides a higher storage density in the same or smaller footprint than conventional local tool buffers. Referring to FIG. 13A, there is shown a graphical representation of the storage density (i.e., ratio of storage space to footprint) for a three pod wide, two pod deep SDR system, such as shown in FIG. 11A. As in the graphical representation of the storage density for conventional buffers in FIGS. 1B–1C, each box represents a space capable of being occupied by a single pod. The storage density for the system shown in FIG. 11A is therefore 4 to 6 or 66%. A system according to the present invention one pod deep and three units wide would have the same storage density. Referring to FIG. 13B, there is shown a graphical representation of the packing for a four pod wide, two pod deep SDR system. The storage density for such a system is 6 to 8 or 75%. The prior art is unable to provide a storage density in that range.

Figure 13C:
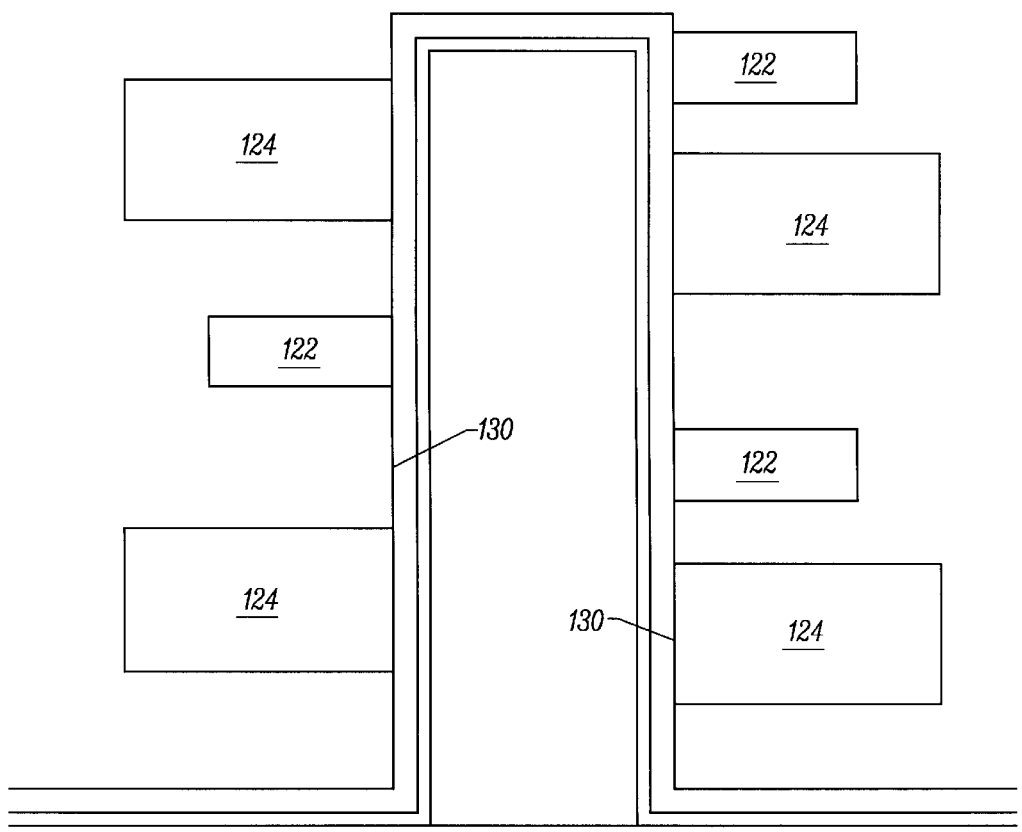
FIG. 13C is a top view of a process tool bay including stockers according to the present invention.

As shown in FIG. 13C, the SDR system 122 may be provided at various locations throughout the bay, as a stand-alone stocker. In a preferred embodiment, the system 122 may be oriented so that its side is adjacent the tool bay wall (as in the embodiment of FIGS. 8A and 8B). Alternatively, the SDR system according to this embodiment may be partially within the tool bay and partially in the chase. It is understood that there may be other orientations of the SDR system according to this embodiment. Moreover, it is contemplated that the SDR system of this embodiment may be combined with embodiments described above, such as for example the back-to-back SDR system disclosed with respect to FIGS. 11A and 11B. Such an embodiment may include one or more conveyors for moving the pods between the front and rear SDR stocker units. This design provides rapid pod transfer in the X-Z plane by the gripper and in the Y direction by the conveyors, without danger of the various transports interfering with each other.

Software Control System

The operation and software control of the buffer system will now be described with reference to the flowchart shown in FIG. 14. The material control software in general includes a fab-wide scheduling routine and, in some instances, an intrabay scheduling routine. The fab-wide and intrabay scheduling routines are generally unaffected by the present invention, except to the extent the hand-off to the process tool becomes less critical with respect to arrival.

U.S. Pat. No. 5,166,884, U.S. Pat. No. 4,974,166, and U.S. Pat. No. 5,097,421, assigned to the owner of the present invention, each relate to a so-called "SMART tag" system, wherein a wafer lot may be tracked at its various locations around a wafer fab, and may be controlled with respect to which processes are performed on that lot. The above-named three patents are hereby incorporated by reference in their entirety. In particular, each pod includes an electronic tag 162 (FIG. 9A) which stores information identifying the particular wafer lot within the pod, and the particular processes to be performed on the lot. The gripper may include sensors capable of retrieving this information from the SMART tags, and communicating this information to the buffer scheduling routine and tool. Instead of or in addition to the SMART tag system, a bar code reader or RF receiver may be provided on gripper 120. In such embodiments, as the gripper moves horizontally along a row and/or vertically along a column, the bar code reader reads a bar code, or the RF receiver receives indicial information, provided on each pod in the row and/or column. It is also contemplated that the horizontal rail have a plurality of such sensors along its length, with each sensor aligned with a column of storage shelves. In this embodiment, the sensors may map each of the pods in the SDR system during one complete vertical pass of the horizontal rail. This information can also be used to track the pods and control the movement of the pods. It is understood that various other schemes may be used for storing information relating to a particular wafer lot, and for retrieving and transferring this information. For example, in an alternative embodiment of the invention, the pods may be devoid of any SMART tag, bar code or other indicial mark.

In some instances, a wafer lot within a pod is designated as a priority lot. For various reasons, it may be desired to complete the semiconductor processing sequence on a particular lot in a shortened period of time. Accordingly, once it has been determined that a tool load port is soon to be available in the step 200, the scheduling routine next checks to see if a priority lot is scheduled in a step 204. If there is, the priority lot is obtained and loaded onto the tool load port when it becomes available, in a step 206. The information indicating the priority nature of a lot may be contained in the pod SMART tag, encoded in the bar code or RF transmitter, or indicated by some other known indicial scheme. The scheduling routine then returns to step 200 to check for the next available tool load port.

If the scheduling routine determines that there is no priority lot, it next checks to see if there is any normal production wafer lot in the buffer scheduled in a step 208. In a preferred embodiment, the scheduling routine utilizes FIFO logic so that, where more than one normal production lot is scheduled, the program causes the buffer to select the lot which has been stored for the longest period of time, and transfers that lot onto the tool load port in a step 210.

On occasion, lots are sent through a process to test various parameters on the wafers and/or within the process tool. These lots are referred to as "engineering lots". Alternatively, an operator may want to interrupt the scheduling routine, and manually retrieve a pod for relocation to another tool or location. If the scheduling routine determines in a step 208 that there are no normal production lots scheduled for the soon to be available tool load port, the routine next checks in a step 212 for any engineering or interrupt lots. If there are, those lots are transferred to the manual I/O port, again applying FIFO logic, in a step 214. The information indicating that a lot is an engineering or interrupt lot may be contained in the pod SMART tag, encoded in the bar code or RF transmitter, or indicated by some other known indicial scheme. The routine next returns to step 200 to check for the next available lot. If a tool load port is soon to be available, and there are no priority, normal production, or engineering/interrupt lots scheduled for the available process tool in the bay 100, the automated material handling system (AMHS) scheduling routine operates to obtain a lot scheduled for the available process tool, and that lot is transferred to the buffer in a step 216.

As discussed above, it is important that the process not be left idle. Therefore, the highest priority for the intrabay scheduling routine in a preferred embodiment is to ensure that pods are quickly removed and replaced on the tool load ports in steps 202–216 upon completion of a process. However, in the event that the scheduling routine determines that there are no tool load ports which are soon to be available (for example, within the next 1 to 2 minutes), the next order of priority for the buffer scheduling routine is to bring more pods into the buffer. The intrabay scheduling routine may use various criteria for selecting a shelf on which to store the pod, such as for example, the nearest available shelf to the load port to which a pod is to be next transferred. In a step 221, the scheduling routine also stores information contained in the lot's SMART tag, bar code, or RF transmitter relating to the process or processes to be performed on that lot, whether the lot is a priority or engineering/interrupt lot, the address of the shelf on which the pod is stored, and the time at which the pod is stored. This information is used in steps 204–212 to determine the priority in which the pods are transferred to the load ports.

On occasion, more than one process is performed on a lot within the same buffer. As such, once a lot has been removed from a load port upon completion of a process thereon, the scheduling routine checks in a step 222 whether that lot is to undergo additional processes within another tool served by the SDR system. If there are, the lot is returned to a storage shelf 114 in the step 220, and if there are no additional processes to be performed on that lot in the tools served by the SDR system, the pod is preferably transferred back to the delivery system in a step 224.

Figure 14:
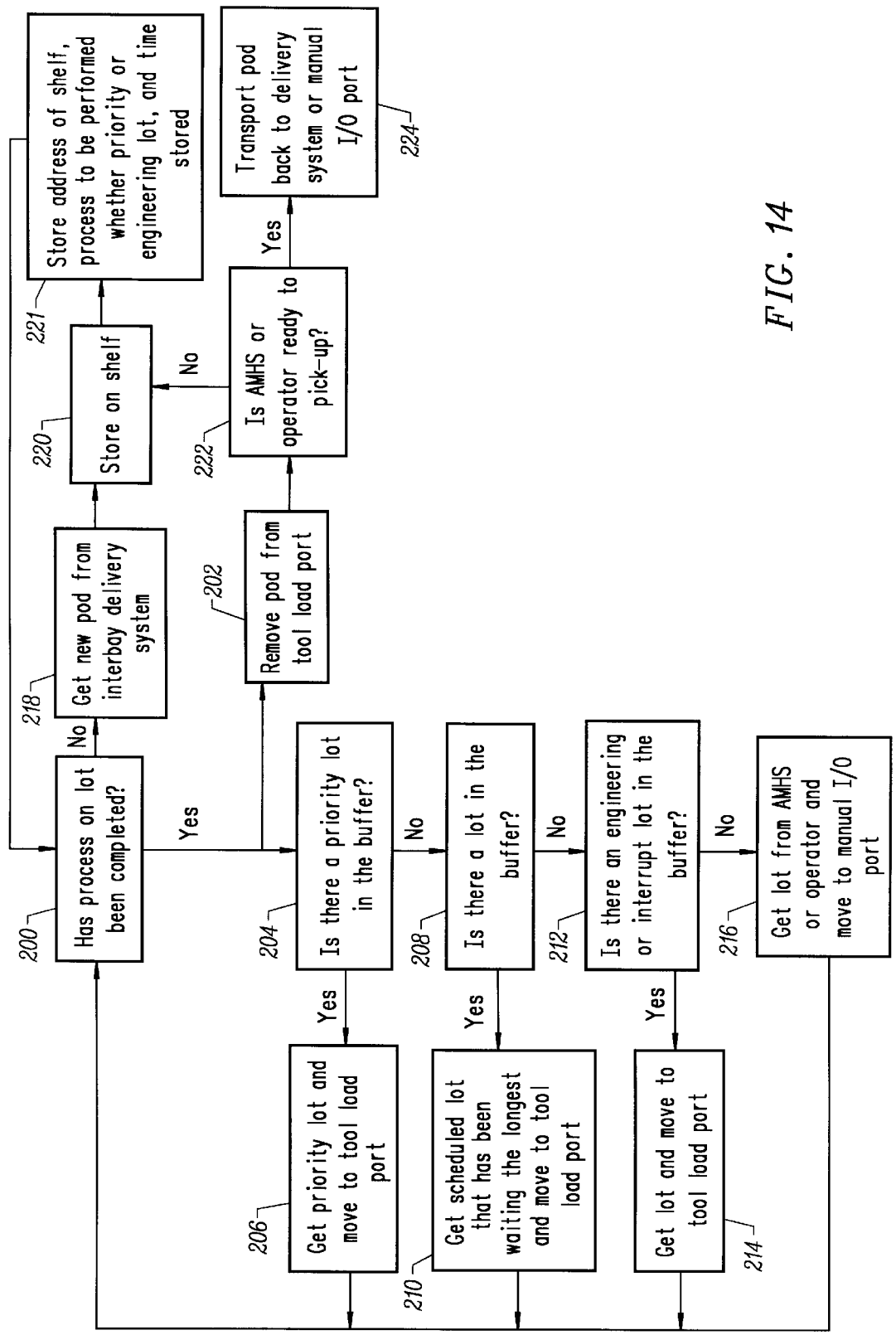
FIG. 14 is a flow chart of the software control according to the present invention.

As would be appreciated by those of skill in the art, the system of operation shown in FIG. 14 and described above is only one of many embodiments for the control of the buffer according to the present invention. Several other priorities and contingencies may be included in the routine in addition to or instead of the above-described criteria for determining the operation of the system. Additionally, the described system is a pull based system. That is, the algorithm focuses on whether a tool load port within the buffer is open, and if so, a pod is transferred, or pulled, to the available load port.

It is also contemplated that the software control include code for handling power failure to the tool. As would be appreciated by those of skill in the art, in the event of power failure, various error recovery schemes may be provided in the software control for re-identifying the number, location, and/or identity of the lots upon resumption of processing. In one embodiment of the invention, the gripper may return to a home position upon loss of power. The algorithm handling power failure may cooperate with sensors on the gripper and/or horizontal rail to ensure that the gripper may return to the home position without colliding with other structures in the SDR system or on the tool.

The gripper may include various other positional sensors (not shown) for sensing positions of the pods as it moves. As would be appreciated by those of skill in the art, such sensors may be used to ensure that the pods are properly positioned on the shelves. The sensor system may be any of various sensing systems, such as for example optical block-the-beam or reflective sensors, IR sensors, lasers or video cameras such as a charge coupled display (CCD) camera.

In order to introduce a pod into the SDR system, a human operator generally locates the pod on the manual I/O port 128. However, manual location of a pod on the manual I/O port 128 when all other available storage locations within the SDR system are occupied by pods would result in a system back-up, in that the X-Z transfer mechanism would not be able to lift and transfer a pod anywhere. The above-described scheduling routine is able to control the automated delivery equipment to avoid this situation. However, human operators may not be able to recognize this situation. Therefore, according to a further embodiment of the invention, if all available storage locations in the SDR system are occupied, the software control system automatically moves a pod to the manual I/O port 128, to thereby prevent an operator from loading another pod thereon and for ensuring that at least one shelf is available to shuffle and transport pods around the SDR system.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A storage and transport mechanism for storing and/or transporting a container, the storage and transport mechanism being capable of being mounted on first and second tools associated with a semiconductor process, comprising:

a frame having a shelf for supporting the container;

vertical rails mounted on opposed sides of said frame;

a horizontal rail translationally mounted to said vertical rails, the horizontal rail having a first portion of a first length allowing the mechanism to operate on the first tool, and a second portion of a second length allowing the mechanism to operate on the second tool, the first length being different than the second length;

a gripper translationally mounted to said horizontal rail, said gripper being capable of gripping and transporting the container to said shelf; and a drive apparatus mounted on said frame, said drive apparatus being adapted to drive said horizontal rail vertically along said vertical rails.

2. A storage and transport mechanism for storing and/or transporting a container as recited in claim 1, wherein the mechanism is capable of being mounted above the first and second tools.

3. A storage and transport mechanism for storing and/or transporting a container as recited in claim 2, wherein the mechanism adds insubstantially to the footprint of the first and second tools.

4. A storage and transport mechanism for storing and/or transporting a container having a handle on a top portion of the container, the mechanism capable of being mounted on first and second tools associated with a semiconductor process, the mechanism comprising:
- a frame having vertical rails on opposed sides of said frame,
- a horizontal rail translationally mounted to said vertical rails, the horizontal rail having a first portion of a first length allowing the mechanism to operate on the first tool, and a second portion of a second length allowing the mechanism to operate on the second tool, the first length being different than the second length;
- a shelf, connected to the frame, capable of supporting the container;
- a gripper translationally mounted to said horizontal rail, said gripper being capable of gripping and transporting the container and passing over a container supported on said shelf with portions of said gripper and the handle of the container occupying a common horizontal plane; and
- a drive apparatus mounted on said frame capable of driving said horizontal rail vertically along said vertical rails.

5. A storage and transport mechanism for storing and/or transporting a container as recited in claim 4, wherein the mechanism is capable of being mounted above the first and second tools.

6. A storage and transport mechanism for storing and/or transporting a container as recited in claim 5, wherein the mechanism adds insubstantially to the footprint of the first and second tools.

7. A system for storing containers, the system comprising:
- a support structure having a supporting wall, the support structure being capable of being mounted on first and second tools;
- a plurality of shelves positioned along the supporting wall, each shelf being adapted to support at least one container;
- a pair of vertical rails lying in a plane and connected to said support structure, the plane being spaced apart from and substantially parallel to the supporting wall;
- a horizontal rail extending between and translationally mounted to said pair of vertical rails, said horizontal rail having a first portion of a first length allowing the system to operate with the first tool, and a second portion of a second length allowing the system to operate with the second tool, the first length being different than the second length; and
- a gripper translationally mounted to said horizontal rail and shaped to grip a container, such that the gripper may move a container from said first and second tools to any of said plurality of shelves by moving horizontally along said horizontal rail as the horizontal rail moves vertically along said vertical rails.

8. A system as recited in claim 7, wherein each of said plurality of shelves is formed of a rigid material having low particulating and outgassing properties.

9. A system as recited in claim 7, wherein each of said plurality of shelves is formed of aluminum and has an anodized surface finish.

10. A system as recited in claim 7, wherein at least one of said plurality of shelves further comprises mounting pins for mating with grooves in a container in order to secure the container to the shelf.

11. A system as recited in claim 7, wherein said plurality of shelves are aligned in columns.

12. A system as recited in claim 7, wherein a portion of the gripper is shaped to receive and support a handle on a container.

13. A system as recited in claim 7, wherein a portion of the gripper includes upwardly protruding pins configured to secure a container on the gripper.

14. A system as recited in claim 13, wherein at least one of said plurality of shelves is shaped to receive a container secured on the gripper by the protruding pins.

* * * * *